US 6,678,843 B2

(12) United States Patent
Giulietti et al.

(10) Patent No.: US 6,678,843 B2
(45) Date of Patent: Jan. 13, 2004

(54) METHOD AND APPARATUS FOR INTERLEAVING, DEINTERLEAVING AND COMBINED INTERLEAVING-DEINTERLEAVING

(75) Inventors: Alexandre Giulietti, Sao Paulo (BR); Veerle Derudder, Boortmeerbeek (BE); Bruno Bougard, Carnieres (BE); Gokhan Cosgul, Fremont, CA (US); Michael Thul, Wintrich (DE); Jochen Uwe Giese, Bad Bentheim (DE); Curt Schurgers, Arendonk (BE)

(73) Assignee: Interuniversitair Microelektronics Centrum (IMEC), Leuven (BE)

( * ) Notice: Subject to any disclaimer, the term of this patent is extended or adjusted under 35 U.S.C. 154(b) by 0 days.

(21) Appl. No.: 10/151,700

(22) Filed: May 17, 2002

(65) Prior Publication Data

US 2003/0014700 A1 Jan. 16, 2003

Related U.S. Application Data

(63) Continuation-in-part of application No. 09/507,545, filed on Feb. 18, 2000
(60) Provisional application No. 60/292,155, filed on May 18, 2001, provisional application No. 60/120,738, filed on Feb. 18, 1999, and provisional application No. 60/152,514, filed on Sep. 2, 1999.

(51) Int. Cl.[7] .................. G06F 11/00; H03M 13/00
(52) U.S. Cl. .................... 714/701; 714/786
(58) Field of Search ................ 714/786, 755, 714/795, 201

(56) References Cited

U.S. PATENT DOCUMENTS 5,721,745 A * 2/1998 Hladik et al. ............. 714/786
5,933,462 A 8/1999 Viterbi et al. ............. 375/341
6,023,783 A 2/2000 Divsalar et al. ........... 714/792
6,304,995 B1 * 10/2001 Smith et al. .............. 714/786

FOREIGN PATENT DOCUMENTS

EP 0 827 284 A1 3/1998
WO WO 96/13105 5/1996

OTHER PUBLICATIONS

Halter S, et al. "Reconfigurable signal Processor for Channel Cording & Decoding in Low SNR Wireless Communications." IEEE Workshop in Signal Processing Systems, SIPS, Design and Implementation, Oct. 8, 1998, pp. 260–274.
Hsu J–M, et al. "A Parallel Decoding Scheme for Turbo Codes." ISCAS 1998. Proceedings of the 1998 IEEE International Symposium on Circuits and Systems, Monterey, CA, May 31—Jun. 3, 1998, New York, NY: IEEE, US, vol. 1, May 31, 1998, pp. 445–448.

(List continued on next page.)

Primary Examiner—Albert Decady
Assistant Examiner—Shelly A. Chase
(74) Attorney, Agent, or Firm—Knobbe, Martens, Olson & Bear, LLP

(57) ABSTRACT

Methods and apparatus wherein subsequent permutation and inverse permutation operations provide inputs in correct order for first and second processes. Processes needing inputs in original order and processes needing inputs in permuted order can be distinguished, thereby using one of the processes as reference process. Permutation and inverse permutation operations which can fit into a turbo coding system and in systems applying the turbo coding principle. At least one permutation and one inverse permutation operation can be performed subsequently. Permutation and inverse permutation operations may be altered by scheduling linear writing and reading operation and permutated or inverse permutated writing and reading operations. These methods enable parallel execution of sub-processes, where the processes producing and consuming data can be performed in a parallel way, and the writing and reading operations to and from a memory can be performed in a parallel way.

21 Claims, 15 Drawing Sheets

OTHER PUBLICATIONS

Schurgers, et al. "Energy Efficient Data Transfer and Storage Organization for a MAP Turbo Decoder Module." Proceedings 1999 International Symposium on Low Power Electronics and Design. San Diego, CA, Aug. 16–17, 1999, International Symposium on Low Power Electronics and Design, New York, NY: ACM, US, Aug. 16, 1999, pp. 76–81.

Viterbi A. J., "An Intuitive Justification and a Simplified Implementation of the Map Decoder for Convolutional Codes," IEEE Journal on Selected Areas in Communications, IEEE Inc., New York, US vol. 16, No. 2, Feb. 1, 1998, pp. 260–264.

European Search Report. Application No. EP 00 20 0557. Date of Completion, May 28, 2002.

Joeressen, et al., "High–Speed VLSI Architectures for Soft–Output Viterbi Decoding", Vol. 8, No. 2, 1994 pp. 169–181.

Garrett, et al., "Low Power Architecture of the Soft–Output Viterbi Algorithm", ISLPED 1998, pp. 262–267.

Berrou, et al., Near Shannon Limit Error–Correcting Coding and Decoding: Turbo–Codes (1), IEEE, 1993, pp. 1064–1070.

S. Pietrobon, "Efficient Implementation of Continuous MAP Decoders and a Synchronisation Technique for Turbo Decoders", Int. Symp. on Inform, Theory and its Applications, Sep., 1996, pp. 586–589.

Raouafi, et al. "Saving Memory in Turbo–Decoders Using the Max–Log–MAP Algorithm", IEE Colloquium. Turbo Codes in Digital Broadcasting—Could it Double Capacity?, London, UK 22 Nov. 1999, pp. 14/1–4.

Giulietti, et al., "A Study on Fast, Low–Power VLSI Architectures for Turbo Codes", IMEC, Belgium.

Shannon, C.E., "A Mathematical Theory of Communication", Reprinted with corrections from *The Bell System Technical Journal,* vol. 27, pp. 379–423, 623–656, Jul., Oct., 1948.

Berrou, et al., Near Shannon Limit Error—Correcting Coding and Decoding: Turbo–Codes, IEEE, 1993.

Masera, et al., "VLSI Architecture for Turbo Codes", IEEE Transactions on Very Large Scale Integration (VLSI) Systems, vol. 7, No. 3, Sep. 1999.

Bekooij, et al., "Power–Efficient Application–Specific VLIW Processor for Turbo Decoding", ISSCC 2001, Session 12, Signal Processing for Storage and Coding, 12.1.

Hong, et al., Design and Implementation of a Low Complexity VLSI Turbo–Code Decoder Architecture for Low Energy Mobile Wireless Communications, Journal of VLSI Signal Processing Systems 24, 43–57 (2000).

$3^{rd}$ Generation Partnership Project; Technical Specification Group Radio Access Network; Multiplexing and channel coding (FDD) (Release 1999).

* cited by examiner

METHOD AND APPARATUS FOR INTERLEAVING, DEINTERLEAVING AND COMBINED INTERLEAVING-DEINTERLEAVING

RELATED APPLICATIONS

This application claims the benefit of, and incorporates by reference in its entirety, U.S. Provisional Application No. 60/292,155, filed May 18, 2001 entitled "Method and Apparatus for Interleaving and Deinterleaving", and this application is a continuation-in-part of U.S. patent application Ser. No. 09/507,545, filed Feb. 18, 2000, entitled "System and Method of Turbo Decoding", which in turn claims priority to U.S. Provisional Application No. 60/120,738, filed Feb. 18, 1999, entitled "Methods and System Architectures for Turbo Decoding", and U.S. Provisional Application No. 60/152,514, filed Sep. 2, 1999, entitled "Methods and System Architectures for Turbo Decoding", both of which Provisional Applications are incorporated by reference.

TECHNICAL FIELD OF THE INVENTION

The invention relates to high-speed and low power channel coding in communication systems and coders and decoders providing channel coding and decoding.

BACKGROUND OF THE INVENTION

In digital communication systems, reliable transmission is achieved by means of channel coding, a class of Forward Error Correction (FEC) techniques. Coding the information means adding redundancy to the bit stream at the transmitter side, so that it can be properly reproduced at the receiver side.

Ever more (wireless) networks and services are emerging. Therefore, (wireless) communication systems should strive to utilize the spectrum capacity to its maximum. The theoretical limits of the achievable capacity on a communication channel were set by Shannon's fundamental concepts almost 60 years ago, as described in C. Shannon, "A mathematical theory of communications", Bell Sys. Tech. Journal, vol. 27, October 1948. Decades of innovations in digital communication, signal processing and very large scale integration (VLSI) were needed to bring the efficiency of practical systems near the theoretical bounds. Only recently, a new FEC coding scheme, turbo coding, was conceived, which allows to approach Shannon's limit much closer than any FEC scheme previously known. This coding scheme is described in C. Berrou, A. Glavieux, P. Thitimajshima, "Near Shannon limit error-correcting coding and decoding: turbo-codes", Proc. IEEE ICC, pp.1064–1070, May 1993. In this technique, large coding gains (meaning less transmission power for the same bit error rate (BER) are obtained using two or more constituent codes working on different versions of the information to be transmitted. Decoding is done in an iterative way, using a different decoder for each constituent encoder. The information provided by one decoder is processed iteratively by the other decoder until a certain degree of refinement is achieved. A general turbo coding/decoding scheme for Parallel Concatenated Convolutional Code (PCCC) is depicted in FIG. 1. The information bitstream I to be transmitted is encoded by a first encoder C1 and a second encoder C2, e.g. in a pipeline. The second encoder C2 works on an interleaved version of the information bitstream 1, produced by an interleaver Π. The interleaver Π randomises the information bitstream I to uncorrelate the inputs of the two encoders C1, C2. Three bitstreams are transmitted: the information bitstream itself $X_k$ (called the systematic sequence), the coded sequence $Y_k^1$ and the coded sequence $Y_k^2$ (both called parity sequences). The decoding process begins by receiving partial information from the channel ($X_k$ and $Y_k^1$) and passing it to a first decoder D1. The rest of the information, parity 2 ($Y_k^2$), goes to a second decoder D2 and waits for the rest of the information to catch up. Decoding is based preferably e.g. on a Maximum A Posteriori (MAP) decoding algorithm or on a Soft Output Viterbi Algorithm (SOVA). While the second decoder D2 is waiting, the first decoder D1 makes an estimate of the transmitted information, interleaves it in a first interleaver Π1 to match the format of parity 2, and sends it to the second decoder D2. The second decoder D2 takes information from both the first decoder D1 and the channel and re-estimates the information. This second estimation is looped back, over a second interleaver, being deinterleaver $\Pi1^{-1}$ to the first decoder D1 where the process starts again. The main idea behind iterative decoding is that decoded data is continuously refined. Part of the resulting decoded data (called extrinsic information) produced by each decoder D1 resp. D2 in each iteration is then fed back to the other decoder D2 resp. D1 to be used in another iteration step. Interleaving/deinterleaving stages Π1, $\Pi1^{-1}$ between the two decoders D1, D2 are incorporated to adapt the sequences to the order defined in the encoding step. This cycle of iterations will continue until certain conditions are met, such as a certain number of iterations are performed. The resulting extrinsic information is then no more relevant and the process may stop. The result is the decoded information bitstream U.

Turbo codes have rapidly received a lot of attention, and have been the focus for research since their first publication. Indeed, a gain of 3 dB over conventional coding schemes can be translated into a doubling of battery time, or a gain of 20% in bandwidth efficiency. Knowing the value of these resources, the enormous interest in turbo coding is very evident. As a consequence of their near to optimal performance, turbo coding schemes are now one of the main candidates for upcoming systems such as Universal Mobile Telecommunications Systems (UMTS), satellite UMTS and Digital Video Broadcasting (DVB), as described in $3^{rd}$ Generation Partnership Project (3GPP), Technical Specification Group (TSG), Radio Access Network (RAN), Working Group1, "Multiplexing and channel coding", TS 25.222 V1.0.0 Technical Specification, 1999-04. The acceptance of turbo coding has been spectacular, e.g. as evidenced by the number of publications and theoretical developments, as shown during the $2^{nd}$ International Symposium on Turbo Codes & Related Topics, September 2000, Brest, France. In contrast, the hardware implementation of the turbo codes is following this evolution only very slowly. Speed, latency, and most of all power consumption and significant technical problems in implementing the turbo coding principles. Ideally, speeds in the order of 100 Mbps should be achieved in order to meet the ever-growing speed demands. High-speed data services require high coding gains, making concatenated coding with iterative decoding (turbo coding) highly suitable. The performance advantage of turbo coding comes at the cost of increased digital processing complexity and decoding latency. The penalty in complexity (operations per bit) is typically an order of magnitude, if the turbo coding scheme is implemented in a straightforward way. The latency-bottleneck needs to be solved if high-speed, low power turbo coders for real-time applications are envisaged. Current commercially available turbo coding solutions, such as e.g. from Small World Communications, Payneham South, Australia, from sci-worx, Hannover, Germany or from Soft DSP, Seoul, Korea, do not match the speed and power requirements imposed by current high-end communication systems.

Recently, some components for high-speed turbo coders, appropriate for real-time wireless communication (i.e. with low power consumption and low latency) have been reported on in literature, such as e.g. in G. Masera, G. Piccinini, M. Ruo roch, M. Zamboni, "VLSI architectures for Turbo codes", IEEE Transactions in VLSI Systems, 7(3):369–378, September 1999, in J. Dielissen et Al., "Power-Efficient Application-Specific VLIW Processor for Turbo decoding", in ISSCC 2001, San Francisco February 2001, or in Hong, Waynem, and Stark, "Design and Implementation of a Low Complexity VLSI Turbo-Code Decoder Architecture for Low Energy Mobile Wireless Communications", Proceedings of ISLPED 99, 1999. These advanced turbo coders, described in these recent publications, almost all use 'overlapping sliding windows' (OSW) in the decoding processes to increase speed and decrease power consumption. Even better architectures for turbo decoding at high speed, low power, and low latency, have been reported in A. Giulietti, M. Sturm, F. Maessen, B. Gyselinckx, L. van der Perre, "A study on fast, low-power VLSI architectures for turbo codes", International Microelectronics Symposium and Packaging, September 2000, as well as U.S. patent application Ser. No. 09/507,545, entitled "Method and System Architectures for Turbo-Decoding". While solutions for optimizing the decoding processes are available, no attractive results for speeding up the interleaving and de-interleaving operations have been proposed.

As discussed before, turbo decoders, despite their performance close to the channel limits with reasonable decoding complexity, suffer from high latency due to the iterative decoding process, the recursion in the decoding algorithm and the interleaving/deinterleaving between decoding stages. The parallelisation of the MAP decoding algorithm helps to avoid these drawbacks. The use of Overlapping Sliding Windows (OSW) is reported to be a good means of parallelisation, transforming in space the recursion in the MAP algorithm. The OSW scheme requires the use of separate storage elements at the input/output of each window in order to maximize the throughput.

SUMMARY OF CERTAIN INVENTIVE ASPECTS

One aspect of the invention enables fast and easy subsequent interleaving and deinterleaving operations. This is of uttermost importance in channel coding systems for communications systems, featuring low latency, high speed, and low power.

In another aspect the invention enables the use of small memories for implementing an interleaving/deinterleaving operation.

Another aspect of the invention implements fast interleaving/deinterleaving operations.

The aspects of the invention are accomplished by a method of the type comprising executing a first process, thus producing a first output array; writing the first output array into a first memory structure, thereafter reading from the first memory structure an input array; executing a second process, consuming the input array and producing a second output array; writing the second output array into a second memory structure. The writing step to the first memory structure may be in a different order than the reading step from the first memory structure, such that the input array is a first permutation of the first output array. The writing step to the second memory structure may be in a different order than the writing to the first memory structure and is in a different order than the reading from the first memory structure, such that the second output array is a second permutation of the input array, the second permutation being the inverse of the first permutation. The memory structures are physical structures which comprise memory elements which may be binary elements, i.e. they can take one of two values. One value may represent a "1" and the other value the "0" in a binary numbering system. In the method the first memory structure and the second memory structure may be a single memory structure. The skilled person will appreciate that there are available means to control and drive memories, including means for generating addresses and means for selecting an address. The memory structures may comprise means for storing at least an array of the size of the input and output arrays and may comprise separate sub-memories, each of the separate sub-memories comprising means for storing at least parts of the input arrays and output arrays. Each of the separate sub-memories may comprise means for storing at most an array of the size of the input array and output arrays divided by N−1, N being the amount of different sub-memories in a memory structure.

In the method at least one of the first and second processes comprises subprocesses, each sub-process consuming and producing respectively part of the related input and output array. The sub-processes of a process may be executed substantially simultaneously.

The writing of the parts of the output array may be carried out substantially simultaneously, each part being produced by one of the sub-processes of the first or second process. The reading of the parts of the input array may be carried out substantially simultaneously, each part being consumed by one of the sub-processes of the first or second process.

Another embodiment of the invention comprises an apparatus having a first computing device being capable of executing a first process, and producing a first output array; a first memory structure, wherein the first output array can be written; a second computing device being capable of executing a second process, consuming an input array read from the first memory structure; a second memory structure wherein the second output array can be written; means for writing to the first memory structure in a different order than the reading from the first memory structure, such that the input array is a first permutation of the first output array; and means for writing to the second memory structure in a different order than the writing to the first memory structure and in a different order than the reading from the first memory structure, such that the second output array is a second permutation of the input array, the second permutation being the inverse of the first permutation. The first and second memory structure may be a single memory structure. The memory structures are physical structures, which comprise memory elements which may be binary elements, i.e. they can take one of two values. One value may represent a "1" and the other value the "0" in a binary numbering system. The memory structures may comprise a plurality of sub-memories. The computing devices may comprise means for substantially simultaneously executing a plurality of sub-processes, the sub-processes together defining the first and second process. The first and second computing devices may be a single computing device.

Addresses for writing data elements to or for reading data elements from the submemories may be determined in accordance with an algorithm which gives the same result as the following method: an output order of matrix elements of a matrix is determined by reading serial elements into the matrix according to a first direction of the matrix followed by reading the elements from the matrix in a second direction of the matrix, the second direction being different from the first direction and the order of reading out of the matrix elements determines the storage locations of the data elements in the sub-memories. Dimensions of the matrix are selected such that the writing and reading results in a collision-free reading or writing to the sub-memories.

The dimensions of the matrix may be selected such that one of the dimensions does not divide the other of the dimensions. A shifting operation may be performed on the matrix elements read out of the matrix in the first or second directions.

Another embodiment of the invention includes an apparatus for performing iterative decoding on a serial data stream, comprising a plurality of memories, a plurality of decoders, each decoder at least partially decoding a portion of the serial data stream in parallel with the remaining decoders, an address generation circuit for generating addresses for the plurality of memories, a first data router for routing data from the plurality of memories to the plurality of decoders, and a second data router for routing data from the plurality of decoders to the plurality of memories.

The first and second data routers, the plurality of memories and decoders and the address generator may co-operate to provide a first decoder for executing a first process, thus producing a first output array, means for writing the first output array into a first memory, means for reading from the first memory an input array, a second decoder for executing a second process, consuming the input array and producing a second output array, means for writing the second output array into a second memory; such that the input array is a first permutation of the first output array; and such that the second output array is a second permutation of the input array, the second permutation being the inverse of the first permutation.

The address generator may have means for generating addresses for writing data elements to or for reading data elements from the memories in accordance with an algorithm which gives the same result as the following method: an output order of matrix elements of a matrix is determined by reading serial elements into the matrix according to a first direction of the matrix followed by reading the elements from the matrix in a second direction of the matrix, the second direction being different from the first direction and the order of reading out of the matrix elements determines the storage locations of the data elements in the sub-memories.

Another embodiment of the invention concerns methods wherein subsequent permutation and inverse permutation operations, in order to provide inputs in correct order for first and second processes are needed. Processes needing inputs in original order and processes needing inputs in permutated order can be distinguished, thereby using one of the processes as reference process. These different processes can be performed or executed by the same actual hardware.

An embodiment of the invention introduces permutation and inverse permutation operations, and thus fits in a turbo coding system and in systems applying the turbo coding principle. According to one embodiment of the invention, at least one permutation and one inverse permutation operation are performed subsequently.

An aspect of the invention comprises the alternation of permutation and inverse permutation operations, by scheduling linear writing and reading operations and permutated or inverse permutated writing and reading operations.

An embodiment of the invention enables parallel execution of sub-processes. In the parallel methods, the processes producing and consuming data can be performed in a parallel way. Also in the parallel methods, the writing to and the reading operations from a memory can be performed in a parallel way. With a process producing data in a parallel way is meant that several data are produced at the same time, by different sub-processes of the process. With a process consuming data in a parallel way is meant that several data are consumed at the same time, by different sub-processes of the process.

These and other features and advantages of the invention will become apparent from the following detailed description, taken in conjunction with the accompanying drawings, which illustrate, by way of example, the principles of the invention. The detailed description is given for the sake of example only, without limiting the scope of the invention. The reference figures quoted below refer to the attached drawings.

BRIEF DESCRIPTION OF THE DRAWINGS

In the different figures, the same reference numbers refer to the same or analogous elements.

DETAILED DESCRIPTION OF CERTAIN EMBODIMENTS OF THE INVENTION

Definitions

With "writing from a process linearly to a memory" is meant putting data in a memory in the same order as the data is produced by the process. With "reading linearly" is meant getting input data from a memory and providing it to a process in the same order as is obtained from the memory. With "writing from a process permutated to a memory" is meant putting data in a memory in a permutated order relative to the order in which it is produced by the process. With "writing from a process inversely permutated to a memory" is meant putting data in a memory in an inversely permutated order relative to the order in which it is produced by the process. With "reading from a memory permutated to a process" is meant getting data from a memory in a permutated order relatively to the order in which it is placed in the memory. With "reading from a memory inversely permutated" to a process is meant getting data from a memory in an inversely permutated order relative to the order in which it is placed in the memory.

In the following reference will be made to memory collisions. This relates to an attempt to read two data entries from or to write two data entries into one memory at the same time. If the memories are single port memories, such a double read or write is not possible and results in contention as to memory access or a "collision". The term "collision" is also sometimes called a memory contention and methods and apparatus for preventing such double (or triple or more) accesses to a single memory may be called a contention scheme.

System Descriptions

The invention will be described with reference to certain embodiments and drawings but the invention is not limited thereto. The skilled person will appreciate that the invention may find broad application in a variety of implementations and application which lie within the scope of the attached claims.

Figure 1:
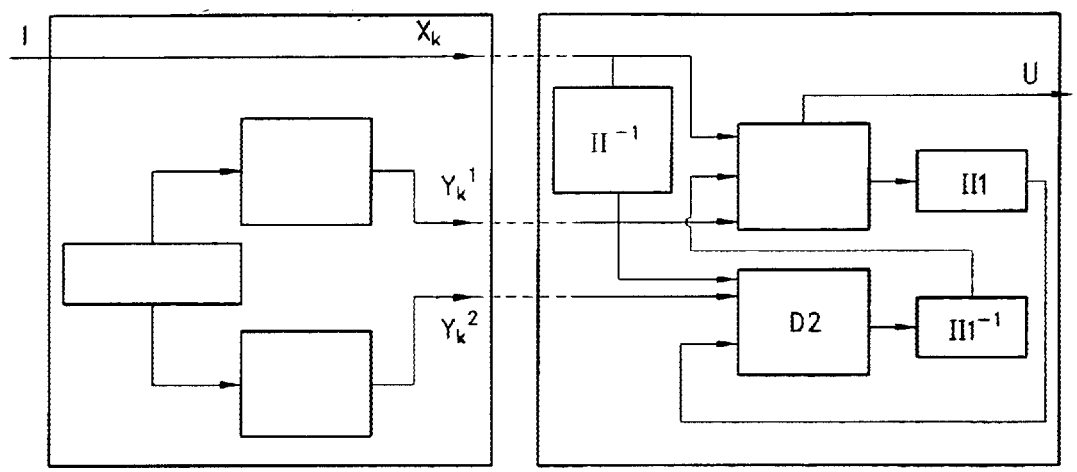
FIG. 1 is a functional block diagram showing a turbo coding/decoding scheme for PCCC, according to the prior art.
Figure 16:
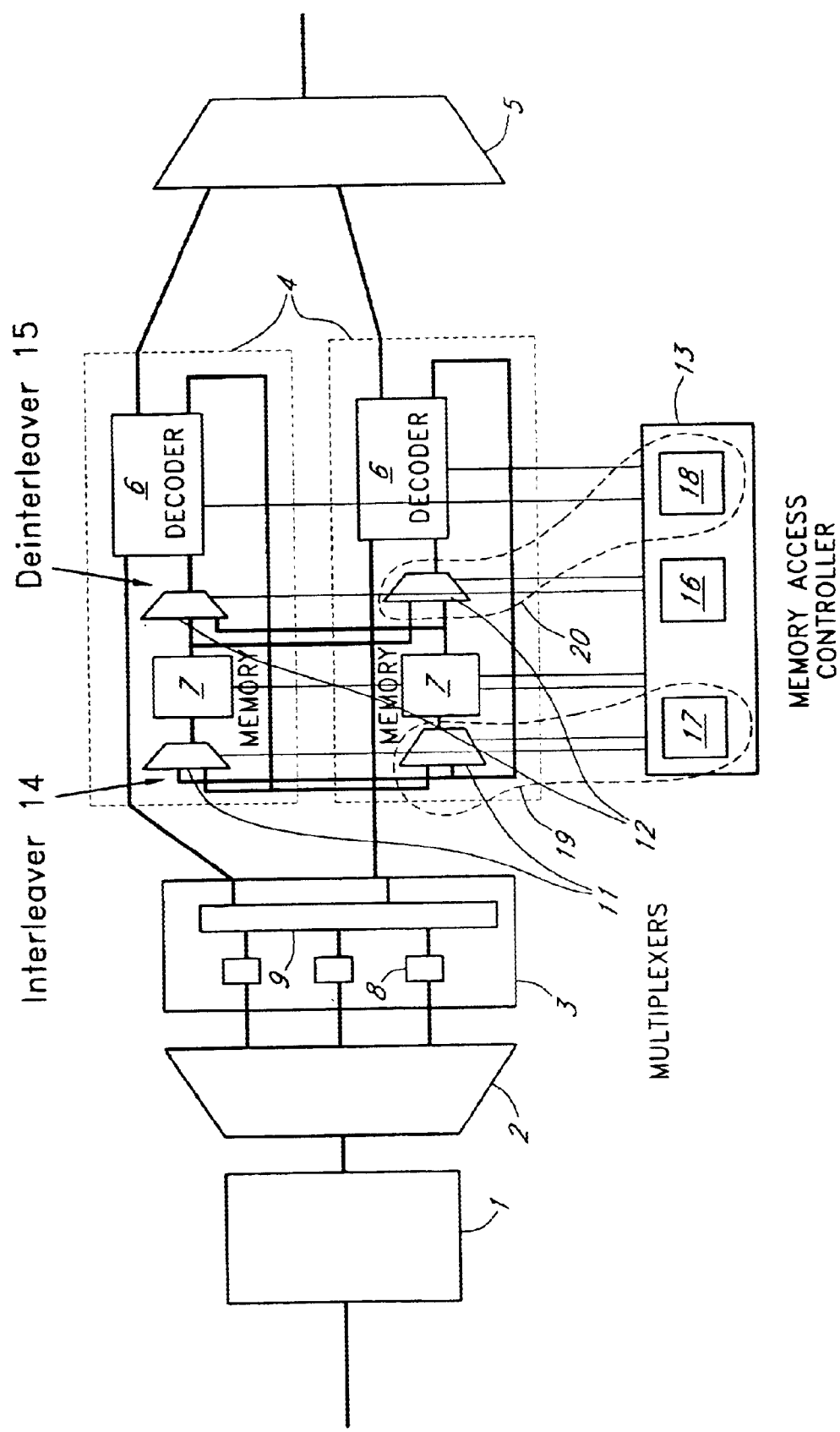
FIG. 16 is a functional block diagram illustrating an apparatus for decoding an encoded input data stream in accordance with an embodiment of the invention.

An apparatus 10 according to an embodiment of the invention for performing the decoding process such as the one of FIG. 1 is shown schematically in FIG. 16. The decoding apparatus is for decoding digital data. The decoding apparatus 10 comprises of a plurality of parallel processing modules 4. Each of the modules 4 is adapted for performing decoding. Each of the modules 4 comprises a decoder module 6 with at least two inputs and at least two outputs. A feedback connection or loop is made between one of the decoder module outputs and one of the decode module inputs. A first memory 7 assigned to a decoder module 6 is provided and is incorporated within the feedback connection. The first memory 7 may be any suitable digital memory device, e.g. preferably Random Access Memory (RAM) but may be a non-volatile memory. Each of the modules 4 is adapted for performing an iterative decoding method on parts of the encoded signal, the iterative decoding method comprising iteratively performing a sequence of decoding steps, wherein each of the decoding steps exploits an interleaved version of the intermediate data elements produced by the preceding decoding step. The data elements are stored in and read from a first memory 7. The first memory 7 in the feedback connection is preferably a single-port memory. However, with reference to the term "memories", any kind of suitable storage unit for digital data is included within the scope of the invention.

An apparatus 10 as shown in FIG. 16 suitable, for instance, for channel decoding, e.g. for turbo decoding, is adapted for inputting an input signal and outputting an output signal, the input signal being, for example a turbo encoded signal, comprising a sequence of blocks, each of the blocks comprising Nb samples, the apparatus comprising a first module 1 with at least as input the encoded input signal, further being adapted for determining reliability measures on the input signal; a second module 2, being adapted for demultiplexing the first module output into N second module outputs and a storage unit 3. Each of the plurality of third modules 4 has at least a module input and a module output, each of the third modules being adapted for performing decoding of one of the blocks; and a fourth module 5 is adapted for multiplexing the module outputs of the third modules 4, having as output the decoded output signal. In the apparatus 10, the reliability measures may be log likelihood ratios.

The apparatus 10 for turbo decoding has a number of third modules which is an integer number and the storage unit 3 is adapted for inputting the N second module outputs and outputting M storage unit outputs, each of the M storage unit outputs being an input of a separate third module 4. The storage unit 3 comprises N second memories 8 and an N to M switch 9, M being N−1 or N being larger than or equal to M.

The apparatus 10 for turbo decoding is further characterized in that the decoding in the third modules 4 comprises an iterative sequence of a set of ordered tasks. Each of the third modules 4 comprises a decoder module 6 with at least a first input, a second input, a first output and a second output, the decoder module 6 being adapted for executing the ordered tasks one after another; the first memory 7 has at least a memory input and a memory output. Further, a memory access controller 13 is provided, being adapted for enabling interleaver functionality of the single port memories 7. The memory access controller 13 may comprise an address generator 16 having two functions. It generates the address where a data element is to be stored in the memories 7 and it also generates the memory location from which a data element is to be read. A first data router controller 17 determines which memory 7 in which module 4 is to be used for storing a particular data element. A second data router controller 18 determines from which first memory 7 in which module 4 a memory location is to be read. The selection of the first memory 7 is performed by first and second multiplexers 11, 12 which are under the control of the first and second data router controllers 17, 18, respectively. The operation of the address generator 13 is one aspect of the invention as the selection of storage and read locations is used in accordance with any of the embodiments of the methods of the invention to eliminate memory access contentions (collisions) in first memories 7 when performing the decoding steps. Hence, the address controller 13 may be configured to carry out any of the collision free memory access schemes of the invention. A first data router 19 is provided by co-operation between the first data router controller 17 and first multiplexers 11. The first multiplexer 11 generally has more than one input, usually the number of inputs is equal to the number of modules 4. Each input to the first multiplexer 11 is a feedback line from a decoder 6 in one of the modules 4. The first multiplexer 11 comprises means to select one of its inputs for transferring data elements via an output to a memory 7. As shown the memory 7 is that one associated with first multiplexer 11 in its module 4. However, the invention is not limited thereto, and other arrangements are included within the scope of the invention. The address generator 13, the first data router controller 17 and the first multiplexers 11, when carrying out a process in accordance with the invention, may also co-operate together to form what can be described functionally as an interleaver 14. Provision is also made for signals from the decoder modules 6 to the memory access controller 13, e.g. to indicate when the decoder is ready.

The output of each memory 7 is connected to a second multiplexer 12. Each second multiplexer 12 generally has more than one input, usually the same number of inputs as number of modules 4. The second multiplexer 12 has means for selecting one of its inputs and for transferring data elements to a decoder 6. As shown the decoder 6 is the one associated with the second multiplexer 12 in the same module 4. However, the invention is not limited thereto, and other arrangements are included within the scope of the invention. The second multiplexers 12 and a second data router controller 18 cooperate together to form a second data router 20 for routing data elements between memories 7 and decoders 6. The second multiplexers 12, the second data router controller 18 and the address generator 13, when carrying out a process in accordance with the invention, may also be described functionally as forming a deinterleaver 15.

Figure 2A:
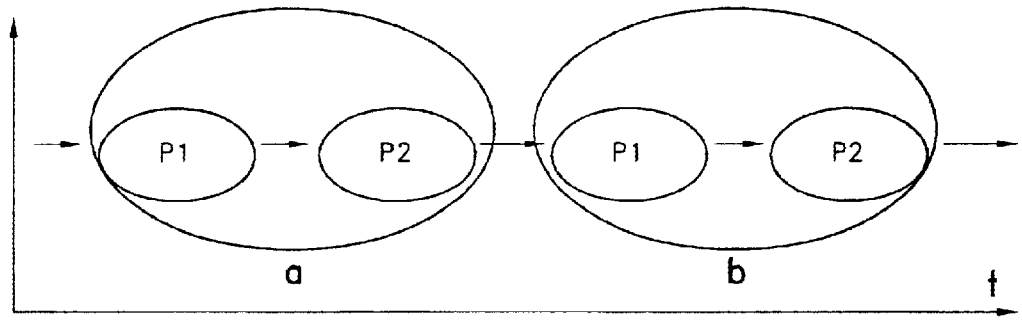
FIG. 2A is a flowchart illustrating a sequence of processes executed in a sequential way.
Figure 2B:
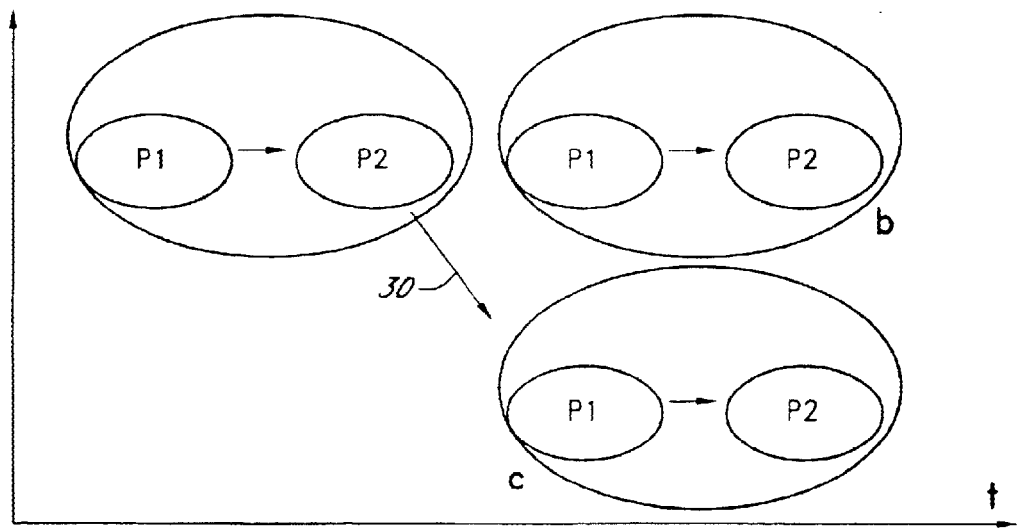
FIG. 2B is a flowchart illustrating a sequence of processes executed in a parallelised way.

As described above the apparatus 10, is able to carry out a series of iterative processes on data elements of an input stream. In FIG. 2A a sequence of processes P1, P2 is considered, comprising a repetition of a first process P1 and a second process P2. The processes P1, P2 may be the decoding steps of a turbo decoding algorithm, carried out in a first decoder D1 and a second decoder D2, as shown in FIG. 1. The sequence of processes P1, P2 is executed in a sequential way, meaning first execution a of process P1, followed by execution of process P2, as illustrated in part "a" of FIG. 2A, and next repeating this procedure, as illustrated in part "b" of FIG. 2A. It is to be noted that, as a function of time, process P1 generates information that is used as input for process P2. Process P1 is then repeated later, using information obtained from process P2 from a previous step and so on. Alternatively, as shown in FIG. 2B, a parallelised way of executing the sequence of first and second processes P1, P2 can be used, meaning that in steady state, as indicated by parts "b" and "c" in FIG. 2B, execution of repetitions "b" and "c" of processes P1 and P2 happens at substantially the same moment, but on different information. Arrow 30 indicates an information transfer between a first execution "a" of P1 and P2 and a later repetition "c" thereof. Execution "b" of processes P1 and P2 gets its input information from another execution (not represented in the drawing) of processes P1 and P2.

Each process P1, P2 of the sequence produces results in the form of an array or arrays based on array type inputs. The processes P1, P2 use as input array type results, which are in most cases produced by another process of the sequence, except for the initial process of the sequence. For example for FIG. 2A, process P1 of execution b uses as input array type results produced by process P2 of execution step "a".

More in particularly, the processes P1, P2 use or exploit as input the array type results, produced by another process of the sequence after performing a permutation within the array type results. The approach of performing a permutation within arrays between processes is called interleaving.

The sequence of processes P1, P2 is such that between each of the processes an interleaving type step is performed. More in particular, the sequence of processes is such that, when a first interleaving step, carried out before a process P2, is followed by a second interleaving step, carried out after the process P2, the second interleaving step performs an inverse permutation of the first interleaving step. The second interleaving step is often denoted as a deinterleaving step.

Figure 3:
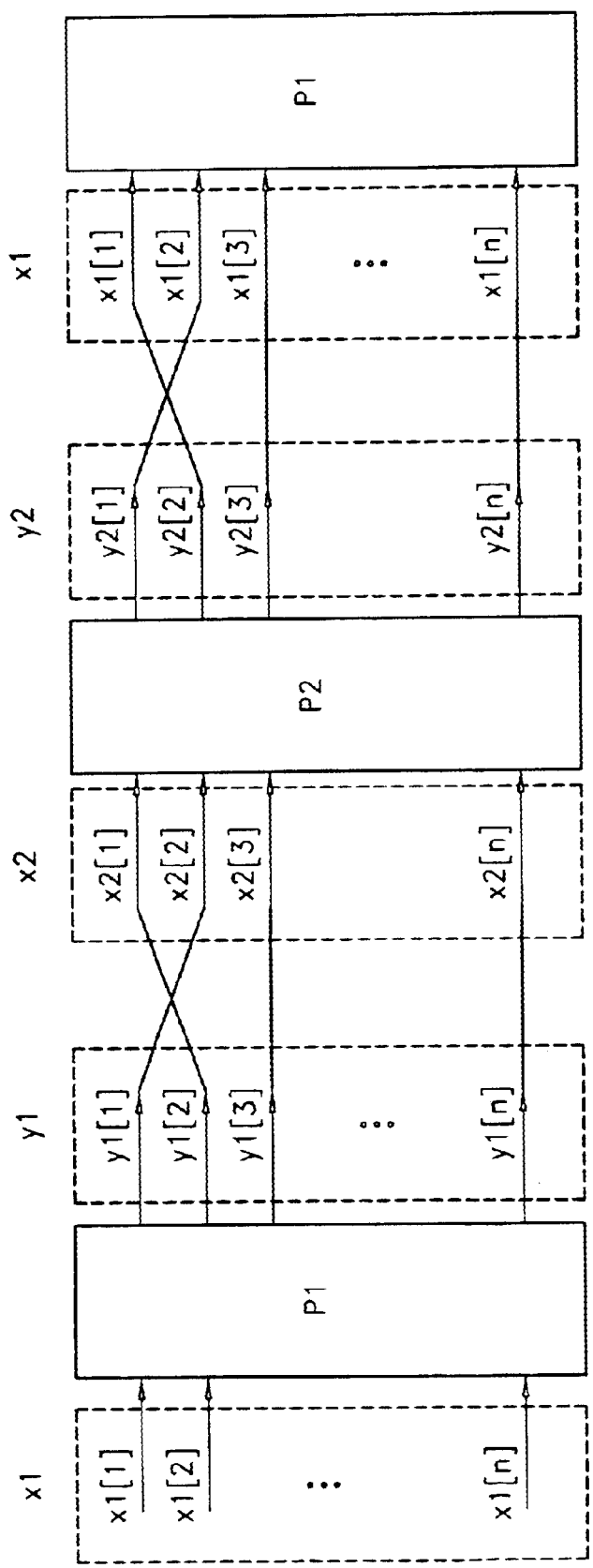
FIG. 3 is a functional block diagram illustrating interleaving and deinterleaving between different processes.

As an example, illustrated in FIG. 3, a process P1 is considered, using as input an array x1, comprising array variables x1[1], x1[2] . . . , x1[n], and producing as output an array y1, comprising array variables y1[1], . . . , y1[n]. Process P2, exploits as input an array x2, comprising the array variables of array y1, but re-ordered, meaning that at least one of said array variables y1[i] is not located at place i within the array x2; for instance x2[1]=y1[2], x2[2]=y1[1], x2[i]=y1[i], for i being each value different from 1 or 2. So x2 is an interleaved version of y1. Process P2, produces as output an array y2, comprising array variables y2[1], y2[2], . . . , y2[n]. A next process P1 exploits as input an array x1, comprising the array variables of array y2, but re-ordered, for instance x1[1]=y2[2], x1[2]=y2[1], x1[i]=y2[i], for i being each value different from 1 or 2.

The execution of said processes P1, P2 together with associated interleaving and de-interleaving steps is preferably performed on a hardware platform or a mixed software/hardware platform, comprising at least one computation unit and at least one memory structure. The computation unit may either be a dedicated computation means for performing said processes P1, P2 (i.e. a "hardware solution"), or a general purpose computation means being programmed for performing said processes P1, P2 (i.e. a "programmable hardware" or mixed "software/hardware"). The dedicated computation means may be programmable logic devices (sometimes referred to as PALs, PLAs, FPLAs, PLDs, EPLDs, EEPLDs, LCAs or FPGAs), which are well-known integrated circuits that provide the advantages of fixed integrated circuits with the flexibility of custom integrated circuits. Such devices allow a user to electrically program standard, off-the-shelf logic elements to meet a user's specific needs, in this case to execute the processes P1, P2.

For a straightforward sequential implementation, wherein a first process P1 is executed on a first computation unit, the outputs of said computation unit are stored in a storing order, i.e. the order in which said outputs are generated in a one-RW (read-write) port memory. Afterwards a second process P2 is executed on a second computation unit. Said second computation unit may be physically the same as the first computation unit (by looping back the output to the input of the first computational unit), or it may be another one. Said second computation unit reads from said one-RW-port memory in an order that is different from said storing order. This sequential implementation has as main drawback the fact that one interleave operation requires at least an amount of abstract memory cycles of twice time the length of said arrays, which are typically large.

It is to be noted that in the above straightforward sequential implementation the storage order in memory, meaning which variables are stored where in the memory, and the timing of memory accesses, meaning when is a certain array variable stored in or read from the memory should be distinguished from each other. In a sequential implementation said storage order and timing are similar.

A situation is considered now wherein said processes P1, P2 can be processed at least partly in parallel, meaning each process P1, P2 is composed of sub-processes, each sub-process being capable of producing part of the array type result, and said parts of the array type results together define the overall process result. Exploiting of such parallelism of said processes could be enhanced by using a memory structure capable of having parallel accesses. For instance, a memory structure can be defined which comprises separately accessible one-RW-port memories. Typically, the amount of separate accessible memories is equal to the amount of sub-processes within each process.

Figure 4:
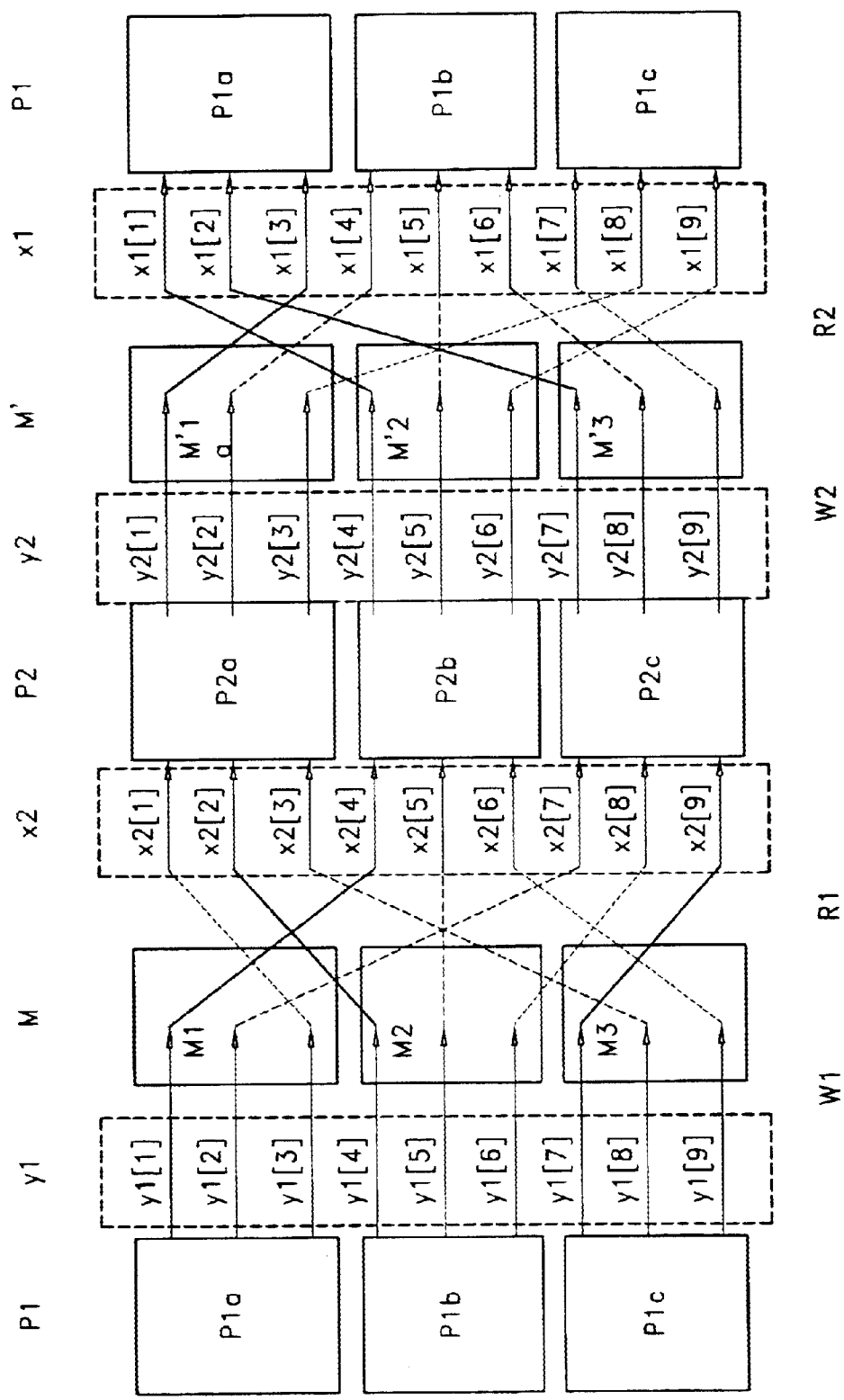
FIG. 4 is a functional block diagram illustrating interleaving and deinterleaving between different processes according to the prior art, whereby processes consist of a plurality of parallel sub-processes, and memory structures each comprise a plurality of sub-memories.

As an example, illustrated in FIG. 4, processes P1, P2 are considered, using input arrays x1, x2 of length 9. Each process P1, P2 comprises three sub-processes, each using an input array of length 3. A memory structure is used, comprising three single port sub-memories, each single port sub-memory being designed such that it can contain at least an array of length 3. The parallelism of the processes and the parallel access facilities of the sub-memories are expected to enable shorter execution times.

As an example, in a first memory cycle the sub-processes P1a, P1b, P1c of process P1 produce each respectively y1[1], y1[4], y1[7] and store that in their associated sub-memory. This means that y1[1] is stored into sub-memory M1, y1[4] is stored into sub-memory M2, and y1[7] is stored in sub-memory M3. In a second memory cycle the sub-processes P1a, P1b, P1c of process P1 produce respectively y1[2], y1[5], and y1[8] and store those values in their associated sub-memories M1, M2, M3 respectively. In a last memory cycle the remaining array variables y1[3], y1[6], y1[9] are computed and stored in their associated sub-memories M1, M2, M3 respectively. It is to be noted here that there is a clear difference between the storage order, indicated by the indices of the array variables, and the production time, indicated by the abstract memory cycle.

Thereafter, the sub-processes P2a, P2b, P2c of process P2 consume the array variables stored in said three sub-memories memory structure M, but in a particular way, such that interleaving appears. For instance in a fourth memory cycle y1[4] is used as input x2[2], y1[1] is used as x2[4] and y1[7] is used as x2[9]. In subsequent memory steps further consuming is done, resulting in y1[8] being used as x2[3], y1[5] being used as x2[5] and y1[2] being used as x2[7]. In a sixth memory cycle y1[3] is used as x2[1], y1[9] is used as x2[6], and y1[6] is used as x2[8].

Said process P2 and its sub-processes P2a, P2b, P2c produce an array result y2, to be stored in the sub-memories M'1, M'2, M'3 of memory M', for instance as follows: in a seventh memory cycle the sub-processes P2a, P2b, P2c of process P2 produce each respectively y2[1], y2[4] and y2[7], and store that in their associated sub-memory, meaning y2[1] into memory M'1, y2[4] in memory M'2 and y2[7] in memory M'3. In subsequent memory steps similar operations are performed.

Now process P1 again exploits the results of process P2. Because of the interleaving-deinterleaving constraint the reading from the memory structure M' by process P1 may be performed in a particular way, meaning y2[1] is used as x1[3] in process P1a, y2[4] is used as x1[1] in process P1a, and y2[7] is used as x1[2] in process P1a. y2[1], y2[4] and y2[7] are those values which are read out first, but they all are to be used as input values for sub-process P1a, which implies that sub-process P1a can only start computing while sub-processes P1b, P1c can not, as they do not have input values yet. This problem is denoted a collision problem, meaning that the parallelization of the processes can not be exploited due to the interleaving-deinterleaving contraint. Similar problems can also occur at the memory side wherein simultaneous accesses to one of said sub-memories M1, M2, M3, respectively M1', M2', M3' of said memory structures M respectively M' are needed.

Summarizing the above, if a process having a serial data input stream is parallelised in a number of parallelly executed sub-processes, and the input data elements and the results of each sub-process are to be stored in memory and if the overall process to be carried out includes a first process and an inverse of this process (as occurs with interleaving/deinterleaving) collisions can occur when memories are to be written and/or read. Intuitively this can be understood in that if a process starts by reading from one particular sub-memory of a plurality of sub-memories and a process is carried out followed by the inverse of this process, then the final step will be to write all the values of the particular sub-memory into that memory at the same time. It is an aspect of the invention to provide methods and apparatus to prevent such memory access collisions or contentions.

It is to be noted that the above example, illustrated in FIG. 4, shows that the interleaving-deinterleaving condition is only fulfilled after execution of a write step W1 to a first memory structure M, a read step R1 from said first memory structure M, executing one of said processes P2 and performing a write step W2 to a second memory structure M' and a read step R2 from said second memory structure M'. This can be observed by recognizing for example that x2[4]=y1[1] (interleave step), x1[1]=y2[4] (deinterleave step).

Figure 5:
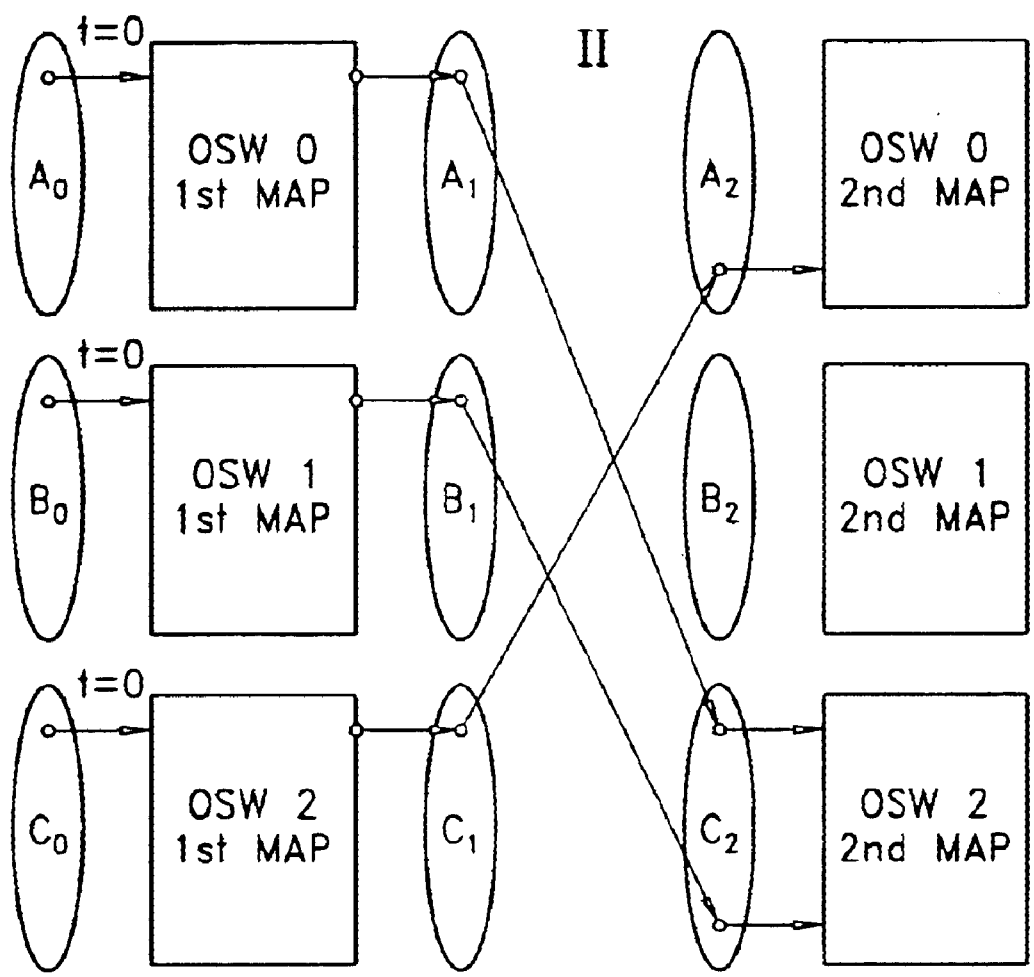
FIG. 5 is a functional block diagram representation of a collision when writing interleaved values produced by a paralleled MAP algorithm.

Hereinafter, the collision problem encountered with turbo coding/decoding is described in more detail. The collision problem is better understood using a graphical representation as in FIG. 5. It shows the architecture of a MAP decoder paralleled by means of 3 overlapping sliding windows (OSW0, OSW1 and OSW2). At time t=0, intrinsic data from storage elements $A_0$, $B_0$ and $C_0$ are fed into the MAP parallel modules OSW0, OSW1 and OSW2 (that will be called simply MAP from now on). The correspondent extrinsic data is produced at the same time at the output of the MAP and written to respective storage elements $A_1$, $B_1$ and $C_1$. An interleaving process Π scrambles these values and writes them into pseudo-random positions in storage elements $A_2$, $B_2$ and $C_2$. As shown in FIG. 5, two values (from $A_1$ and $B_1$) should be written into $C_2$. This cannot happen in the same clock cycle. This characterizes a collision. Because one or more (according to the number of collisions) clock cycles have to elapse in order to be able to write all the data, collisions increase the latency of the decoder. Although the problem has been illustrated in the interleaving process, the same may occur in the deinterleaving process, when extrinsic data from the 2nd MAP should be read into the 1st MAP in the non-interleaved or deinterleaved order.

The collision problem can be solved by trying to determine schedulings of the above type, hence wherein the interleaving-deinterleaving condition is only fulfilled after a four-step write/read/process/write/read sequence of steps. However, it can be shown that such schedulings result in performance loss of the overall process of executing a sequence of processes P1, P2 with interleave/deinterleave operations.

Therefore, in one aspect the invention presents a solution wherein the interleavedeinterleave condition is fulfilled after performing at most three sequential steps. These at most three steps can be either be reading from memory, performing a process and writing to a memory, or writing to memory, performing a process and reading from said memory. Said at most three step interleave-deinterleave condition results can be configured as a collision free operation, hence enabling maximal use of the parallelization of said memory structures M, M' and said processes P1, P2.

Figure 6:
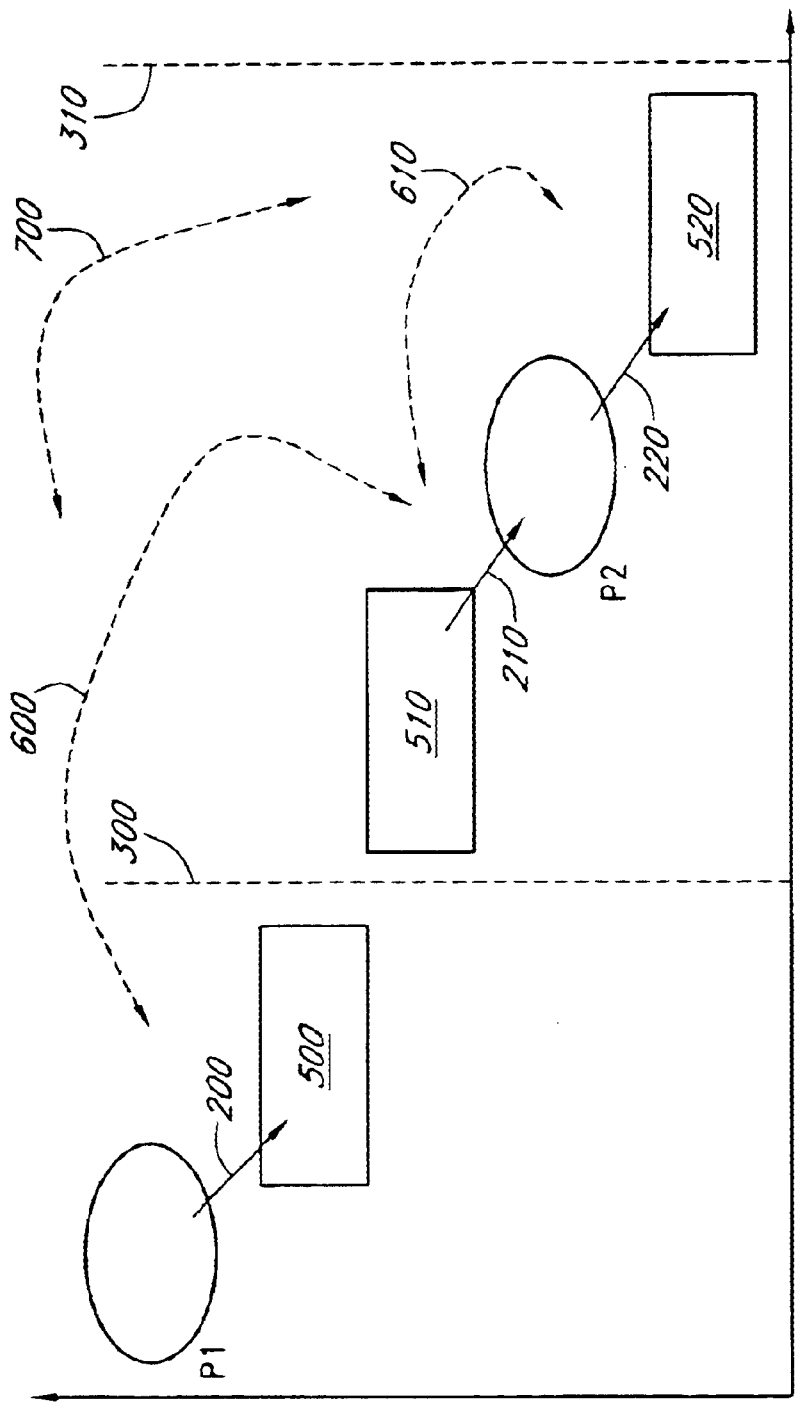
FIG. 6 is a functional schematic illustrating a method for providing interleaved and deinterleaved inputs according to an embodiment of the invention, while executing at least two processes.

In one aspect of the invention, a method for providing interleaved-deinterleaved inputs while executing at least two processes P1, P2 is presented. Different method steps are shown in FIG. 6 in function of time t. Within the method, a first process P1 and a second process P2 are identified. Said first process P1 outputs or produces a first output array 200. Said first output array 200 is written into a first memory structure 300 by a writing process 500. Said writing step 500 can be done after executing said first process P1, or can be partly simultaneously carried out with said first process execution as depicted in FIG. 5. Thereafter, an input array 210 is read from said first memory structure 300 by a reading process 510. Said input array 210 is consumed or used by the second process P2, and execution of said second process P2 results in a second output array 220 produced by said second process P2. Said reading 510 from the first memory structure 300 can be started before starting the execution of said second process P2, or reading 510 and execution of the second process P2 can be partly simultaneously. Said second output array 220 is written into a second memory structure 310 by a writing process 520. Said writing 520 can be after completion of said second process P2 or can be partly simultaneous therewith. The second memory may be any suitable digital memory device, e.g. preferably Random Access Memory (RAM) but may be a nonvolatile memory.

The interleaving-deinterleaving method according to an embodiment of the invention, depicted in FIG. 6, is characterized in that said writing step 500 to said first memory structure 300 is in a different order than said reading step 510 from said first memory structure 300. That way, the input array 210 is a first permutation 600 of said first output array 200. Further, said writing step 520 to said second memory structure 310 is in a different order than said writing step 500 to said first memory structure 300. Said writing step 520 to said second memory structure 310 is in a different order than said reading step 510 from said first memory structure 300 such that said second output array 220 is a second permutation step 610 of said input array 210. Furthermore, said second permutation step 610 is the inverse 700 of said first permutation step 600, hence said second process P2 has as input array 210 an interleaved version of said output array 200 of said first process P1 and vice versa.

Figure 7:
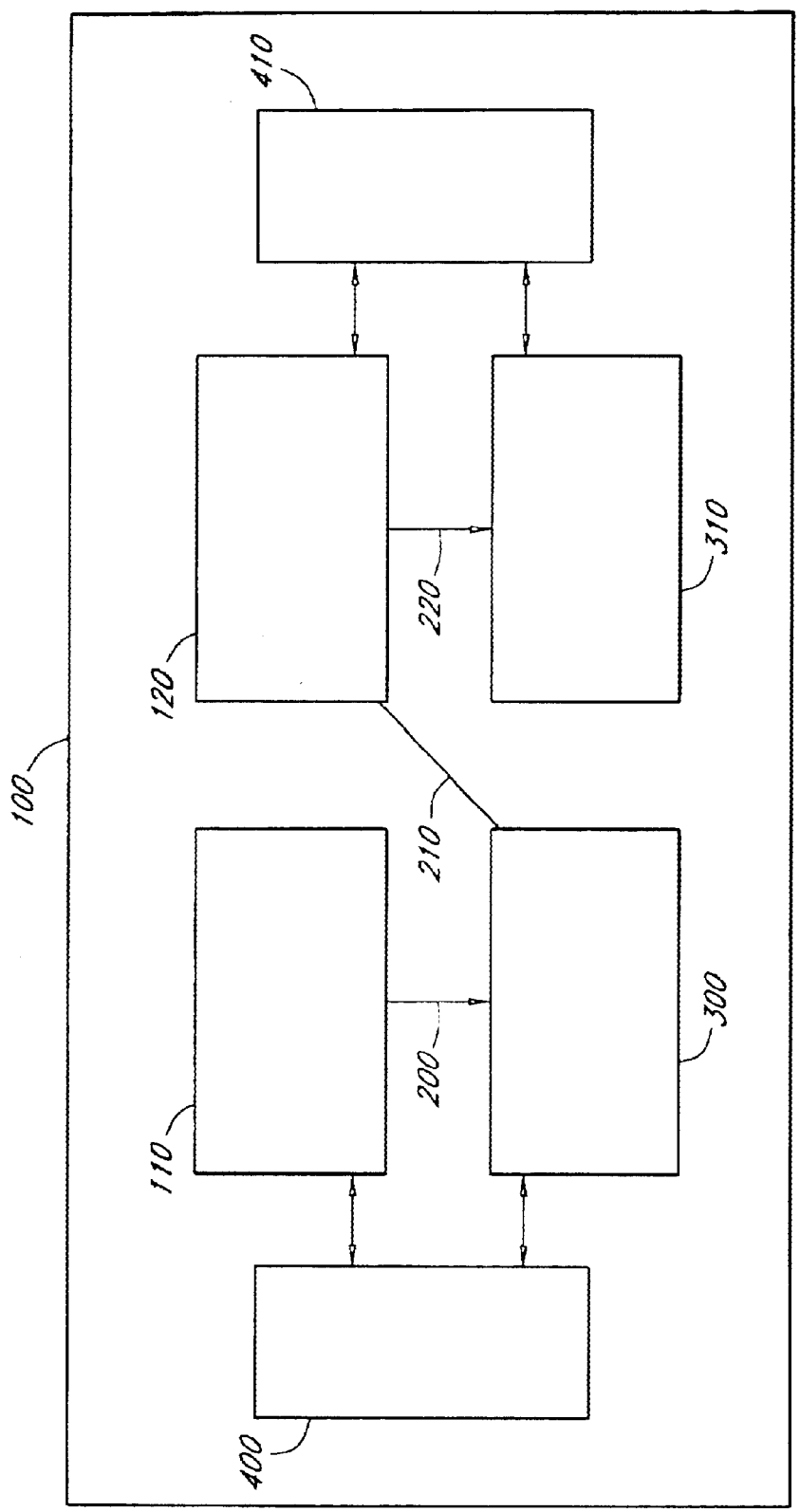
FIG. 7 is a functional block diagram showing a first embodiment of a device for executing an interleaved/deinterleaved dual process according to the invention, the device comprising two computing devices and two memory structures.

In a second aspect of the invention, a device or apparatus 100 for executing said interleaved-deinterleaved dual process is disclosed, as shown in FIG. 7. Within said apparatus 100 two computing devices 110, 120 are identified. Said computing devices 110, 120 can be dedicated hardware for each of said processes P1, P2 or a general purpose programmable device, programmed for executing said processes P1, P2. Said computing devices 110, 120 comprise means for executing at least one of said processes P1, P2. Within said apparatus 100, two memory structures 300, 310 are identified. Within said apparatus 100, a first means 400 for writing to said first memory structure 300 in a different order than said reading step from said first memory structure 300 is provided, such that said second input array 210 is a first permutation of said first output array 200. Said first means 400 can be an address generator, indicating to said computing device 110 and to said first memory 300 which produced or consumed value may be stored or retrieved from which place in the memory 300. Further, there is a second means 410 for writing to said second memory structure 310 in a different order than said writing to said first memory structure 300 and in a different order than said reading from said first memory structure 300. That way, said second output array 220 is a second permutation of said second input array 210, said second permutation being the inverse of said first permutation. Said second means 410 also typically is an address generator, generating addresses for said second computing device 120 and said second memory structure 310.

In an embodiment of the device 100, said computing devices 400, 410 comprise means for substantially simultaneously executing a plurality of sub-processes, said subprocesses together defining said processes P1, P2 run on the computing devices 110, 120.

Figure 8:
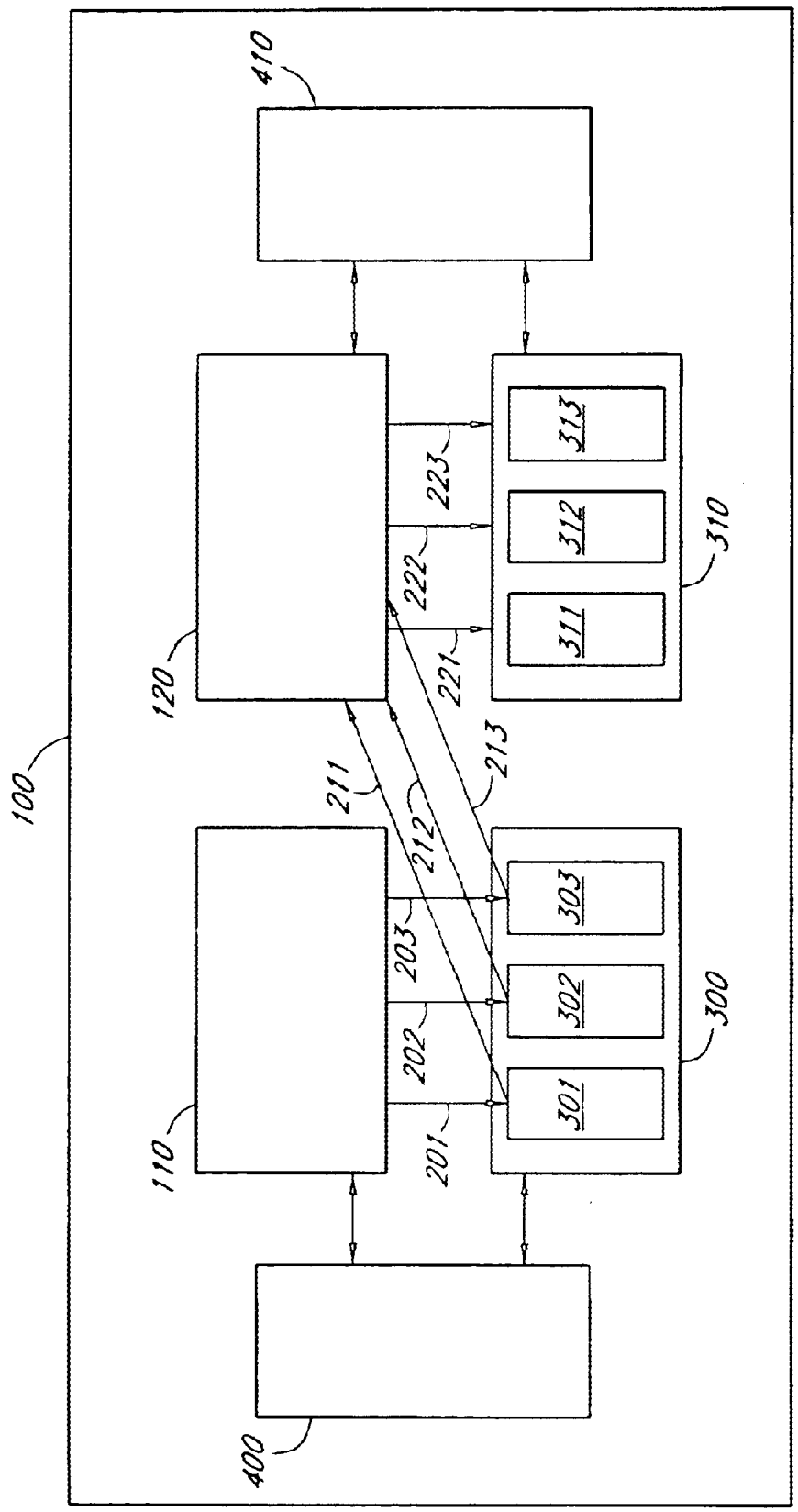
FIG. 8 is a functional block diagram showing a second embodiment of a device according to the invention, with substantially simultaneously accessible sub-memories.

In an alternative embodiment, at least one of said memory structures 300, 310 comprises a plurality of memories 301, 302, 303, respectively 311, 312, 313, as shown in FIG. 8. The computing device 110, executing sub-processes which together define process P1, produces in parallel different parts 201, 202, 203 of the output array 200, which parts are stored in the respective sub-memories 301, 302, 303. The computing device 120, executes sub-processes which together define process P2, and consumes in parallel parts 211, 212, 213 of the input array 210. Computing device 120 generates parts 221, 222, 223 of the output array 220, which parts are each written in sub-memories 311, 312, 313.

Figure 9:
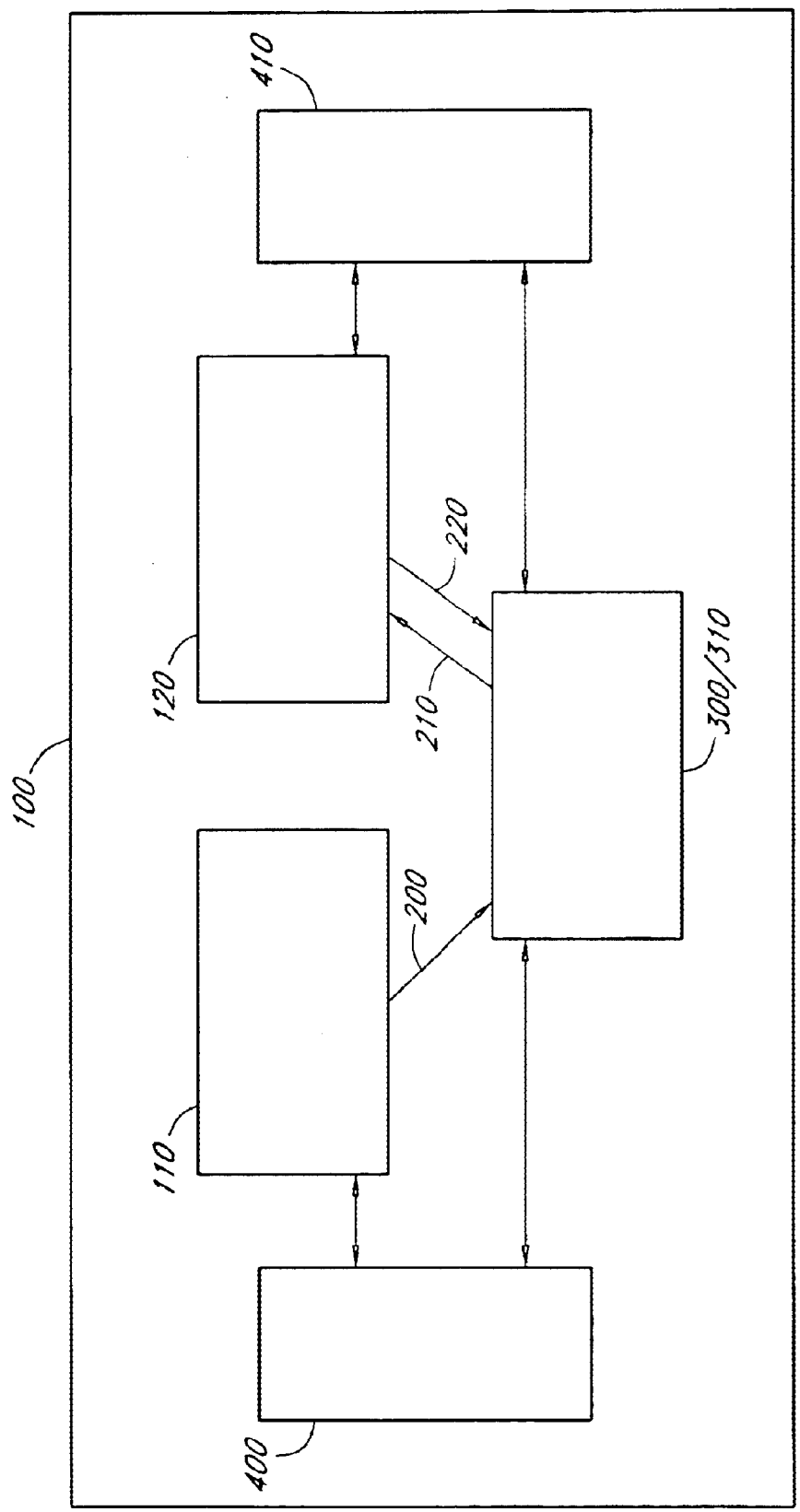
FIG. 9 is a functional block diagram showing a third embodiment of a device according to the invention, comprising a single memory structure.
Figure 10:
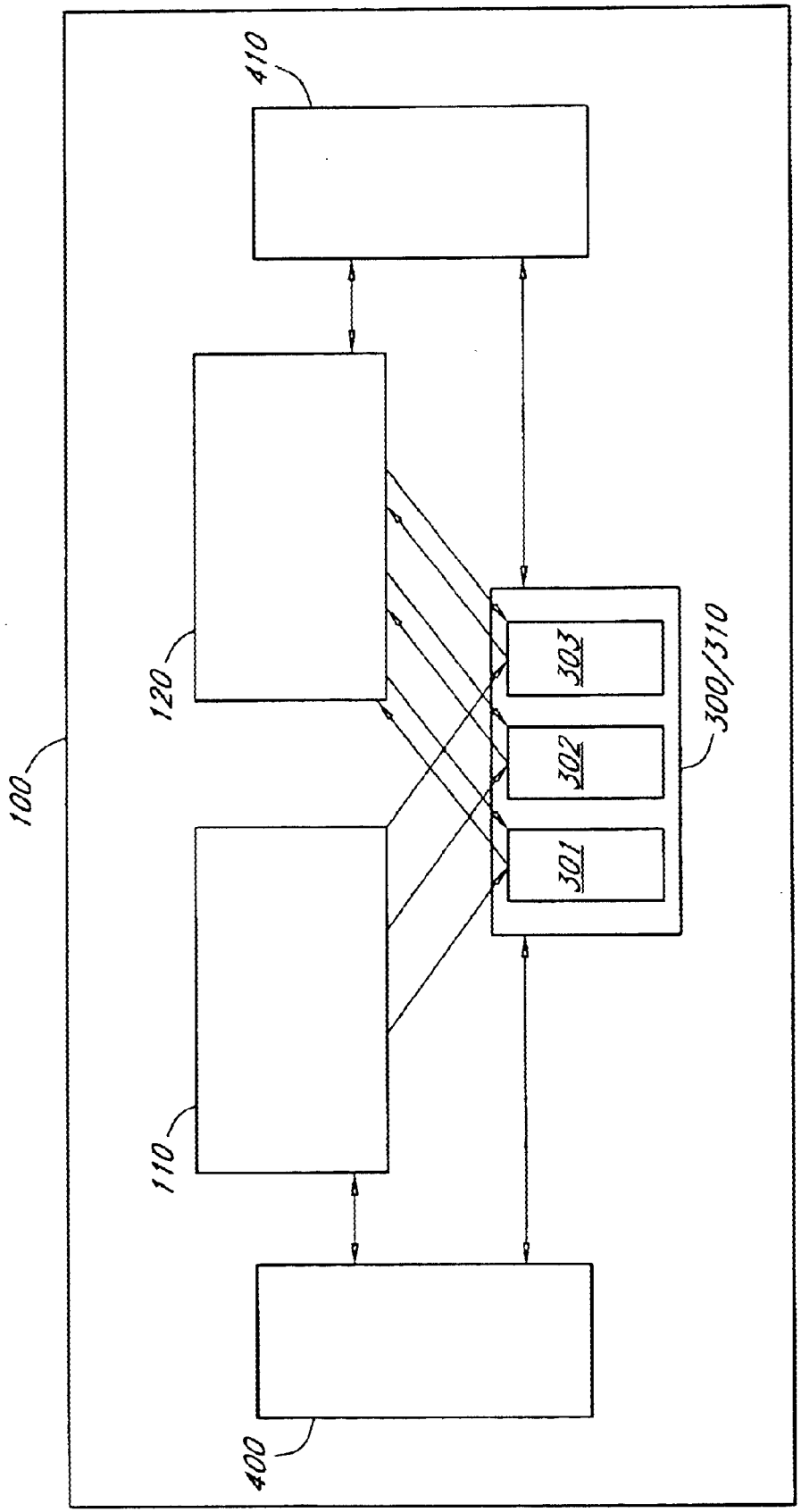
FIG. 10 is a functional block diagram showing a fourth embodiment of a device according to the invention, with a single memory structure having parallel sub-memories.

In yet another embodiment of the device 100, said first and second memory structures 300, 310 refer to a single hardware memory structure 300/310 as shown in FIGS. 9 and 10. In FIG. 9 the single hardware memory structure 300/310 consists of one memory, while in FIG. 10, the single hardware memory structure comprises a plurality of parallel sub-memories e.g. three sub-memories 301, 302, 303. In another embodiment of the device 100, separate hardware for each of said memory structures 300, 310 is defined, as shown in FIGS. 7 and 8.

Figure 11:
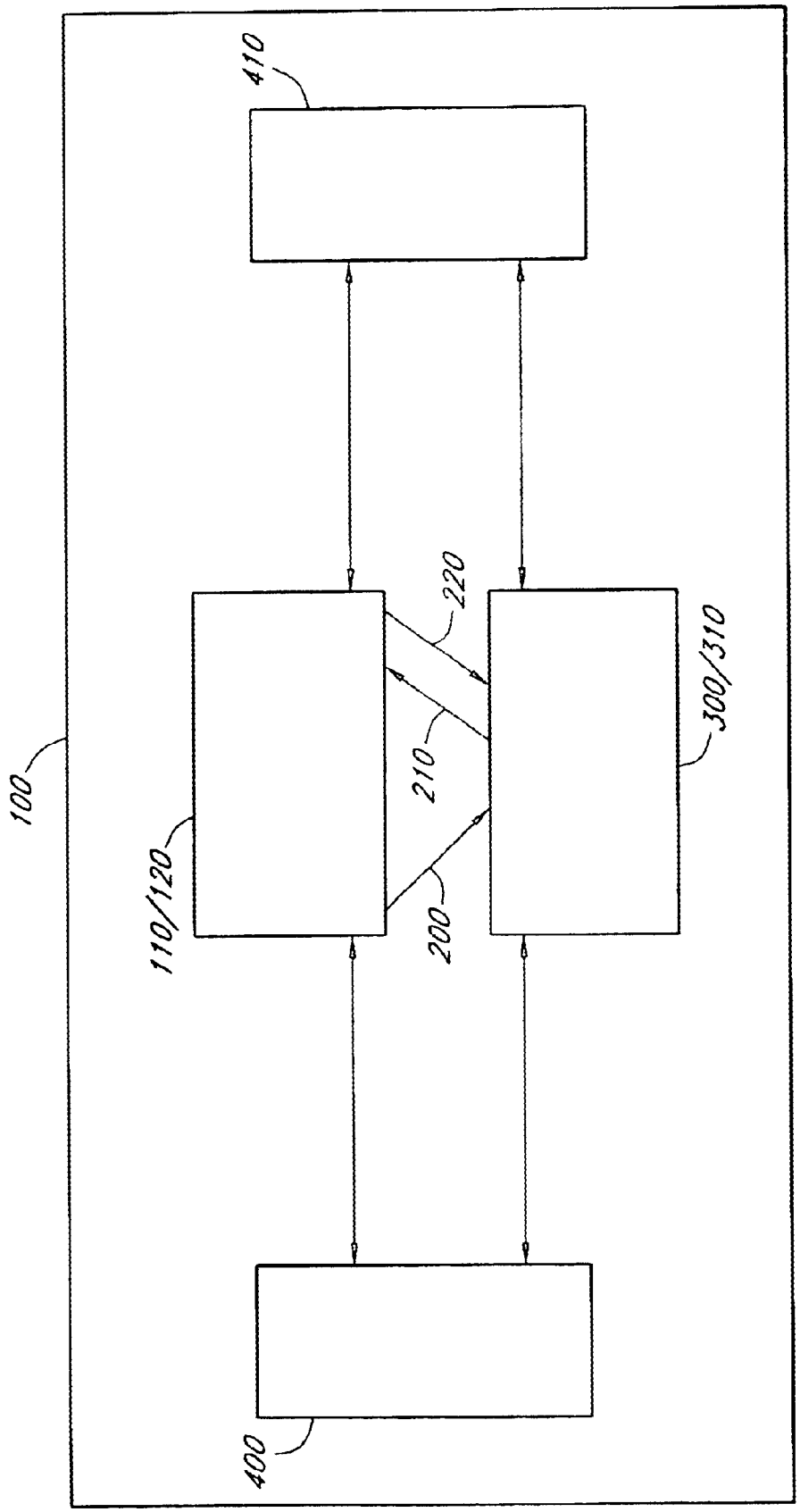
FIG. 11 is a functional block diagram showing a fifth embodiment of a device according to the invention, having a single hardware computing device.

For an embodiment of said apparatus 100, as represented in FIG. 11, said identified two computing devices 110, 120 can refer to a single hardware computing device 110/120. This single hardware computing device 110/120 may read from and write to a single hardware memory structure 300/310, as represented in FIG. 11, or it may read from and write to different memory structures 300, 310 (not represented in the drawings). In another embodiment, separate hardware is foreseen for each of said computing devices 110, 120, as illustrated in FIGS. 7 to 10.

In a first embodiment of the above first aspect (method) of the invention, said method comprises the steps of writing and reading from a single memory structure. Said first memory 300 and second memory 310 hence can refer to a single memory structure 300/310 as shown in FIG. 9.

In a second embodiment of this first aspect, the use of the interleavingdeinterleaving method in the context of substantially simultaneously accessible submemories 301, 302, 303, respectively 311, 312, 313, also denoted parallel submemories, is presented, as shown in FIG. 8. Said memory structures 300, 310 then each comprise a set of sub-memories. The first memory structure 300 comprises e.g. submemories 301, 302 and 303, while the second memory structure 310 comprises e.g. submemories 311, 312 and 313. While each of said memory structures could contain at least an array of the size of said input arrays 210 and output arrays 200, each of said separate sub-memories 301, 302, 303 respectively 311, 312, 313 can contain only a part thereof. In an example, an upper bound for the size of said separate sub-memories 301, 302, 303, 311, 312, 313 can be set by stating that they can store at most an array of the size of said input arrays 210 and output arrays 200, 220 divided by (N−1), N being the amount of different sub-memories in one memory structure 300, 310.

In a third embodiment, the use of the method in the context of a single memory structure 300/310 with parallel sub-memories 301, 302, 303 is disclosed as shown in FIG. 10.

In a fourth embodiment, said processes P1, P2 each comprise sub-processes, each of which is consuming and producing part of said input arrays 210 and output arrays 200, 220. Said parts 201, 202, 203; 211, 212, 213; 221, 222, 223 are such that together they define said input and output arrays 200, 210, 220 respectively. In a further embodiment said sub-processes of a process P1, P2 are executed substantially simultaneously.

In a fifth embodiment, said method with sub-processes is executed in a parallel sub-memory context. Hence said writings of said parts 201, 202, 203 of said first output array 200, each part being produced by one of said sub-processes of said first process P1, are carried out substantially simultaneously, and each sub-process writes to one of said sub-memories 301, 302, 303. Further said reading of said parts 211, 212, 213 of said second input array 210, each part 211, 212, 213 being consumed by one of said sub-processes of said second process P2 is carried out substantially simultaneously. Further, said writing of said parts 221, 222, 223 of said second output array 220, each part 221, 222, 223 being produced by one of said sub-processes of said second process P2 is carried out substantially simultaneously.

Figure 12:
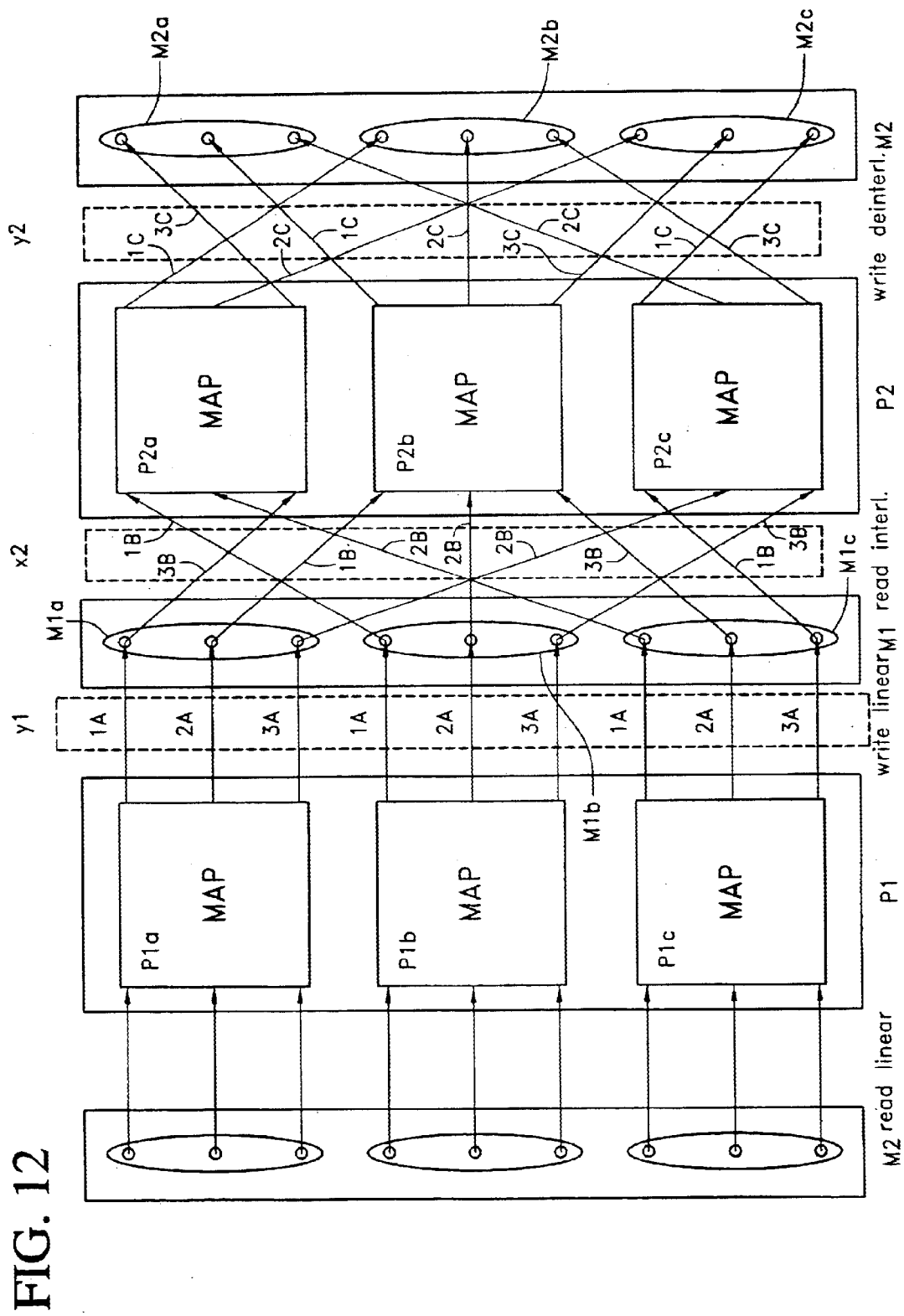
FIG. 12 is a functional block diagram illustrating collision-free scheduling for interleaving/deinterleaving according to an embodiment of the invention.

FIG. 12 shows an example of an embodiment of the invention with 3 subprocesses P1a, P1b, P1c within process P1 and 3 sub-processes P2a, P2b, P2c within process P2. Process P1 is reading from a memory structure M2 and writing to a memory structure M1. Process P2 is reading from a memory structure M1 and writing to a memory structure M2. Each of said memory structures M1, M2 comprises 3 sub-memories, M1a, M1b, M1c and M2a, M2b, M2c respectively. The memories M1a, M1b, M1c and M2a, M2b, M2c respectively are accessible in parallel. Said memory structures M1, M2 can be physically the same hardware. In FIG. 12, a writing from said process P1 to memory structure M1 is denoted with a letter A, a reading from said memory structure M1 to said process P2 is denoted by a letter B, and a writing from said process P2 to said memory structure M2 is denoted by a letter C. The example given and illustrated by FIG. 12 deals with arrays of length 9, but the invention is not limited thereto and in practice deals with huge arrays. Each of the sub-processes deals with an array of lower dimension, here an array of dimension 3. Each memory structure M1, M2 can at least contain an array of length 9, while its sub-memories M1a, M1b, M1c, respectively M2a, M2b, M2c, typically have a lower storage capacity. They can contain at least an array of length 3. The method described enables parallelism, meaning parallel computing of values by said subprocesses P1a, P1b, P1c and P2a, P2b, P2c respectively, and parallel accessing of said sub-memories M1a, M1b, M1c, respectively M2a, M2b, M2c, which is an important advantage of the invented approach. With parallel access is for instance meant that array variable y[1] is written to sub-memory M1a at time step 1A, together with storing array variable y[4] at substantially the same time in sub-memory M1b and storing array variable y[7] at substantially the same time in sub-memory M1c. In a next time step 2A another part of the array variables is stored, more particularly y1[2] in sub-memory M1a, y1[5] in sub-memory M1b and y1[8] in sub-memory M1c, while in time step 3A thereafter the remaining part of the array variables is stored, i.e. y1[3] in sub-memory M1a, y1[6] in sub-memory M1b and y1[9] in sub-memory M1c.

Thereafter, reading from memory structure M1 (with its three sub-memories M1a, M1b and M1c) is performed. A time step 1B, 2B and 3B is identified wherein each time a part (but more than one) of the array variables in memory M1 are read. During each of the time steps 1B, 2B, 3B, a value is read from each of the sub-memories M1a, M1b, M1c by each of the sub-processes P2a, P2b, P2c of the second process P2. In the example given in FIG. 12, during time step 1B, value y1[4] is read from M1b by P2a as input x2[1], value y1[2] is read from M1a by P2b as input x2[4], and value y1[9] is read from M1c by P2c as input x2[7]. During time step 2B, value y1[7] is read from M1c by P2a as input x2[2], value y1[5] is read from M1b by P2b as input x2[5], and value y1[3] is read from M1a by P2c as input x2[8]. During time step 2C, value y1[1] is read from M1a by P2a as input x2[3], value y1[8] is read from M1c by P2b as input x2[6], and value y1[6] is read from M1b by P2c as input x2[9]. The scrambling of the array variables is to be noted, meaning that at least one of the array variable y1[i] is not located at place i within the array x2.

After executing steps B, steps C follow, again with a scrambling, being the inverse of the B scrambling. In particular this means that, during a step C1, the value y2[1] is written by P2a at sub-memory M2b location 1, the value y2[4] is written by P2b at submemory M2a location 2, and the value y2[7] is written by P2c at sub-memory M2c location 3. During step C2, the value y2[2] is written by P2a at sub-memory M2c location 1, the value y2[5] is written by P2b at sub-memory M2b location 2, and the value y2[8] is written by P2c at sub-memory M2a location 3. During step C3, the value y2[3] is written by P2a at sub-memory M2a location 1, the value y2[6] is written by P2b at sub-memory M2c location 2, and the value y2[9] is written by P2c at sub-memory M2a location 3.

The proposed way of writing and reading, results in the required permutations for turbo decoding and prevents collisions. Indeed at no time is simultaneous access (more than one operation) by one or more of the sub-processes to one of the sub-memories needed.

In a third aspect of the invention, a method is disclosed for executing interleaving or deinterleaving. The method generates a collision-free, parallel interleaver in a systematic way, while still keeping good error correction performance.

Figure 13:
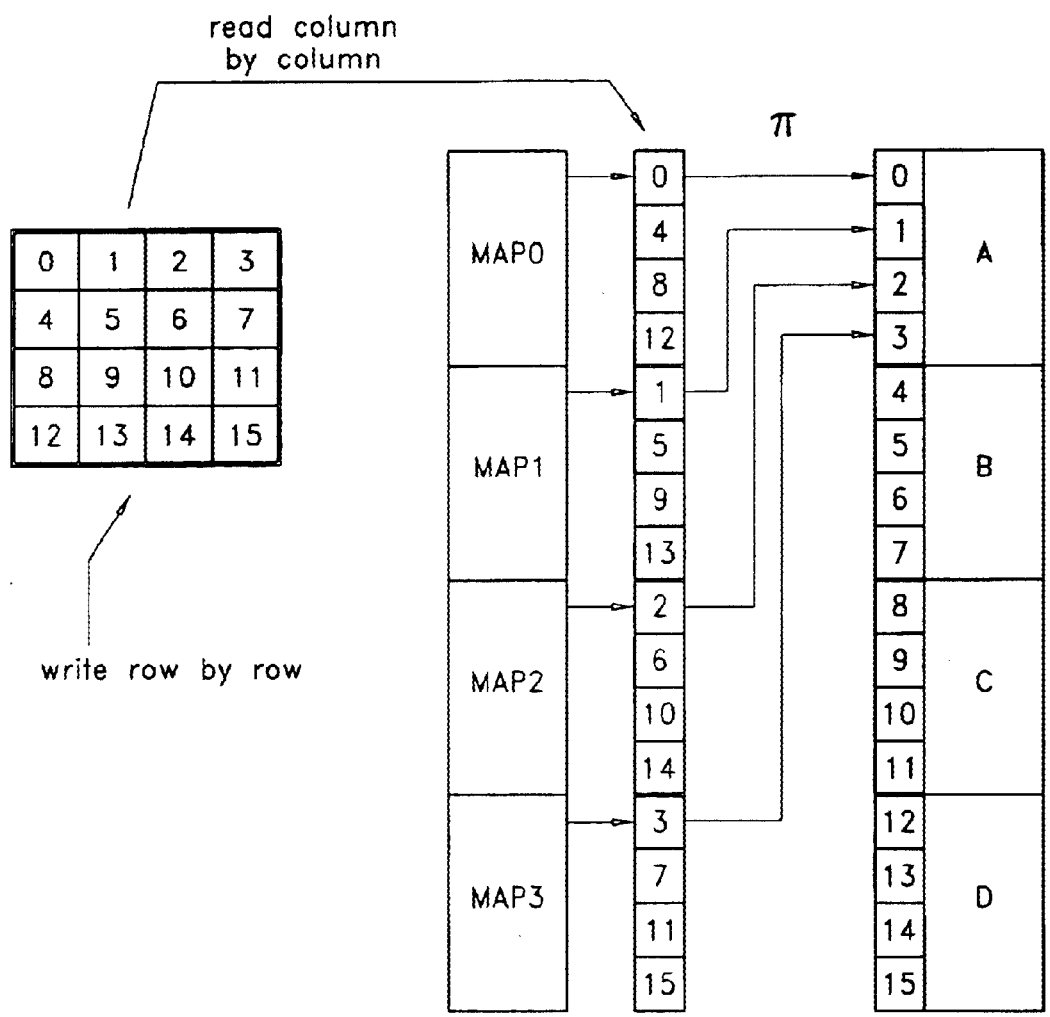
FIG. 13 is a functional block diagram showing a collision-full interleaver.
Figure 14:
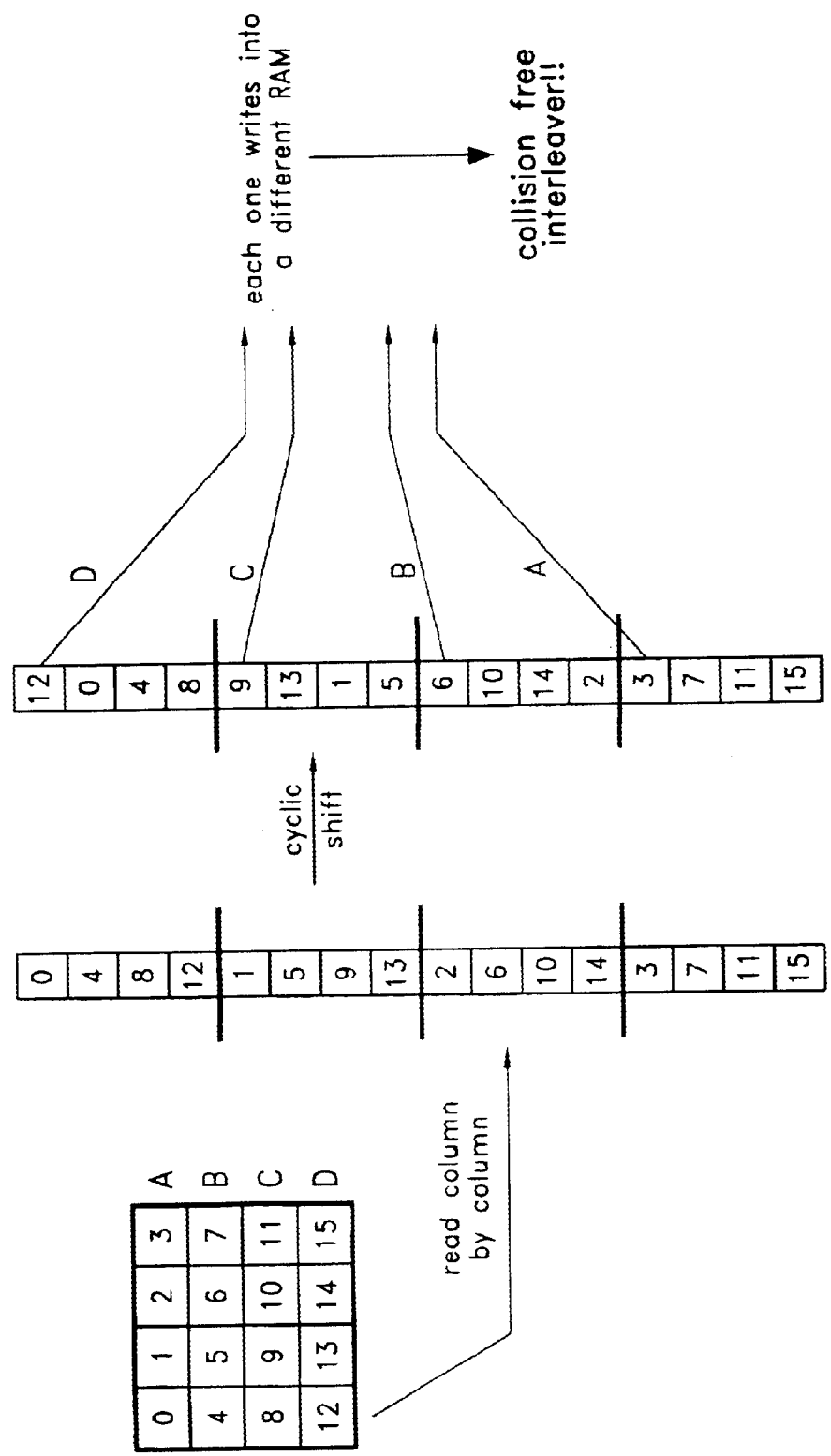
FIG. 14 is a functional block diagram illustrating how to obtain a collision-free interleaver starting from a collision-full interleaver in accordance with an embodiment of the invention.

In order to avoid losing clock cycles due to collision in the decoding process, special interleavers that don't allow collisions are described with reference to an embodiment of the invention. However, this feature implicitly infers some kind of regularity in the permutation pattern that may hamper the coding performance. A systematic way to generate collision-free interleavers but still keeping good spreading properties according to an embodiment of the invention is now disclosed. The method is based on the generation of block interleavers, with additional transformations in order to achieve the collision-free property and better performance at the same time. The interleaver generation is constrained by two parameters: the block size N and the OSW size W. As an example, illustrated in FIG. 14, N=16 and W=4 will be considered. The paralleled MAP will have 4 windows associated with 4 storage elements A, B, C and D. A will store values from 0 to 3; B from 4 to 7; C from 8 to 11 and D from 12 to 15. A first step consists in linearly writing the elements of the permutation table 0, 1, 2, . . . , 15, into a (N/W)×W matrix (4×4 in the present example). If these values are read column by column as normally happens with block interleavers, it is possible to see that there will be a 'collision-full' interleaver, because all MAP modules will try to write into the same storage element every clock size, that is the first extrinsic values produced by each window are written into the same storage element A (FIG. 13). By "collision-full" is meant that collisions or memory access contention cannot be avoided. A collision-free interleaver according to an embodiment of the invention may be generated by starting from such a collision-full interleaver, and performing a cyclic shift, e.g. shifting by one in the columns of the mother matrix of that collision-full interleaver.

This third aspect of the invention discloses a method for generating a collision-free interleaver, comprising the steps of determining an interleaver with inevitable collisions (=collision-full interleaver), and constructing said collision-free interleaver from said interleaver with inevitable collisions.

Said step of determining of a interleaver with inevitable collisions is based on writing the elements of a permutation table with a matrix with particular dimensions in a row-by-row manner and using the permutation obtained by reading said elements from said matrix in a column-by-column manner. By "dimensions" is meant that the matrix used to generate the column or row reading has two dimensions, i.e. number of rows and number of columns. Note that the matrix is a way of generating a sequence of processing the data elements, it does not have to exist physically. More generally said, the writing and reading from said matrix each may be according to another dimension of said matrix (e.g. meaning row or column). Said matrix has as a first dimension of W, being the size of subarrays processed (by an overlapping sliding window process), and a second dimension N/W, with N being the size of the total array, processed by the coding method. Said construction step of providing a collision-free interleaver from the collision-full interleaver includes a shifting operation. Note that it is a conventional option that if N/W is not an integer, to add padding bits to make up to an integer. These padding bits are ignored in the processing.

Providing collision free interleavers can include more complicated combinations of the above methods. Which method is to be used depends upon the values of the block size N and the OSW size W.

W divides N, N/W and W are not multiples: In this case cyclic shifts are not necessary if N/W and W are relative prime. These shifts occur naturally when reading the matrix column-wise. If N/W and W are not relative prime there can be collisions because the storage elements pattern will become periodic. This is solved by applying cyclic shifts in the ensemble of the columns where the pattern repeats, instead of treating the columns separately.

Figure 15:
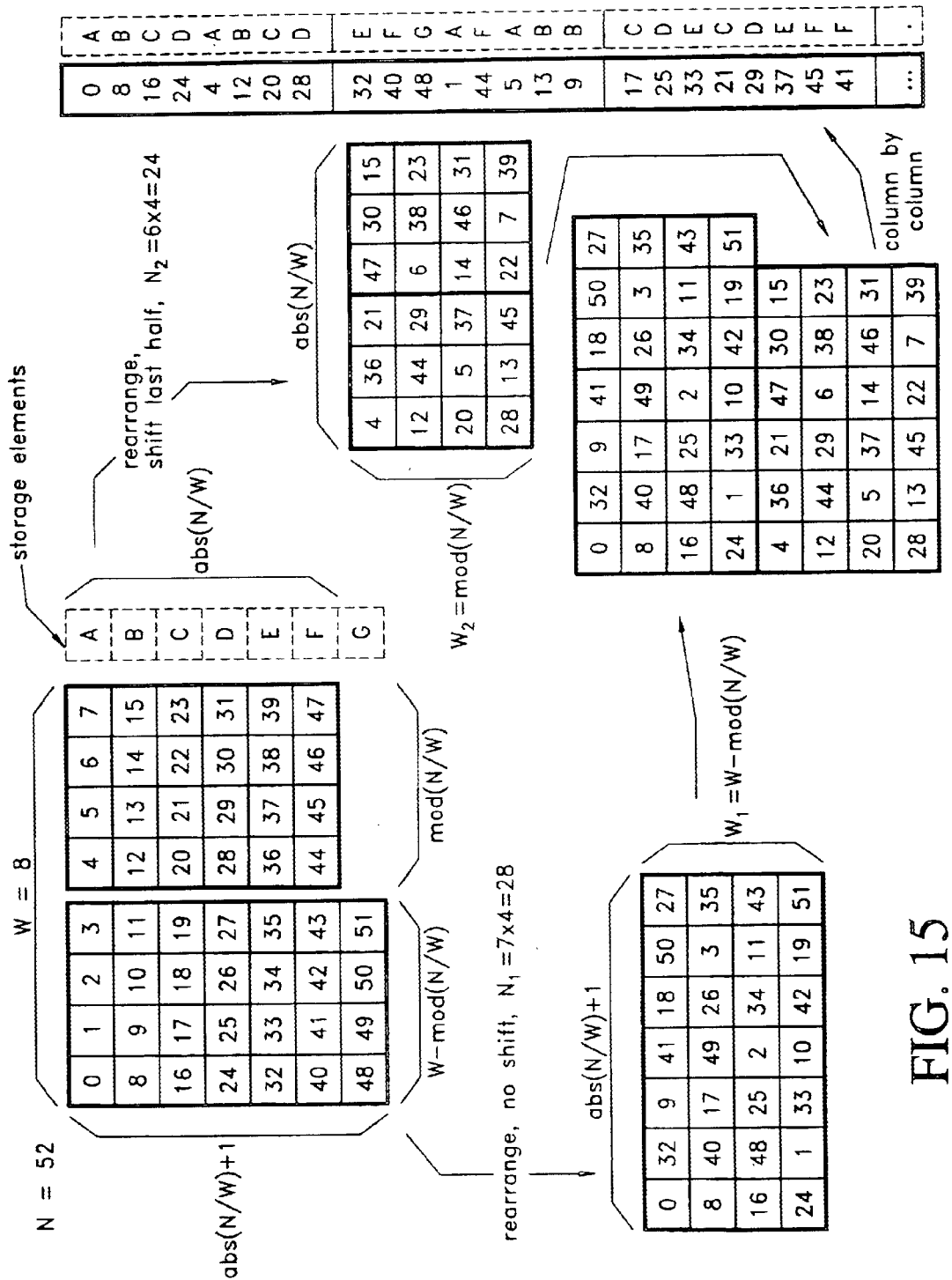
FIG. 15 is a functional block diagram illustrating how to obtain a collision-free interleaver starting from a collision-full interleaver in accordance with a further embodiment of the invention.

W doesn't divide N: In this case the problem is split into two parts, and each part may be treated separately according to the rules defined before. When writing linearly the permutation table row-wise, the last row will be only partially complete. It will contain W-mod(N/W) columns instead of W columns. This matrix is rearranged into two transposed sub-matrices with dimensions (W-mod(N/W)×(abs(N/W+1)) and mod(N/W)×abs (N/W), as depicted in FIG. 15. Each one of these sub-matrices is treated to become collision-free and then they are concatenated. In the example shown in FIG. 15, the first part does not require cyclic shifts because $W_1$ divides $N_1$ but $N_1/W_1$ and $W_1$ are relative primes (e.g. 4 divides 28, 7 and 4 are relative primes). The second part requires a general cyclic shift because $W_2$ divides $N_2$ but $N_2/W_2$ and $W_1$ are not relative primes (e.g. 4 divides 24, 6 and 4 are not relative primes).

The above methods may be used for different interleaver lengths and storage device sizes.

Said interleaving (deinterleaving) method may be used within an iterative coding method with a plurality of parallel computation units and a plurality of storage units, each storage unit being associated with a particular one of said parallel computation units. Each of said computation units then executes a part of the MAP decoding algorithm, more in particular a part of the so-called overlapping sliding window (OSW) computations.

In a third embodiment, the collision-free, parallel interleavers of the third aspect of the invention are used within the context of the first and second aspect of the invention. Indeed an optimum throughput can be obtained when values are consumed and stored in linear order by one of the processes of the sequence of processes used for decoding, as then the problem of generating collisions in the deinterleaving process, being fully determined by its corresponding interleaving process (even if this one is collision-free), is avoided. However still a random permutation order for interleaving or deinterleaving will very likely introduce collision in the accesses to the storage elements. The proposed method generates collision free permutation order without hampering the performance of the turbo coding scheme.

While the invention has been shown and described with reference to preferred embodiments, it will be understood by those skilled in the art that various changes or modifications in form and detail may be made without departing from the scope and spirit of this invention.

What is claimed is:

1. A method of interleaving and deinterleaving, the method comprising:

executing a first process, thereby producing a first output array;

writing the first output array into a first memory structure;

reading an input array from the first memory structure;

executing a second process, thereby consuming the input array and producing a second output array;

writing the second output array into a second memory structure;

wherein writing to the first memory structure is in an order different than the reading from the first memory structure;

wherein the input array is a first permutation of the first output array;

wherein writing to the second memory structure is in a different order than the writing to the first memory structure and is in a different order than the reading from the first memory structure;

wherein the second output array is a second permutation of the input array; and wherein the second permutation is the inverse of the first permutation.

2. The method of claim 1, wherein the first memory structure and the second memory structure comprise a single memory structure.

3. The method of claim 1, wherein at least one of the first and second processes comprises sub-processes, consuming and producing respectively part of the related input and output array.

4. The method of claim 3, wherein the sub-processes of a process are executed substantially simultaneously.

5. The method of claim 4, wherein reading of parts of the input array, each part being consumed by one of the subprocesses of the first or second process, is executed substantially simultaneously.

6. A method of interleaving and deinterleaving, the method comprising:

executing a first process, thereby producing a first output array;

writing the first output array into a first memory structure;

reading an input array from the first memory structure;

executing a second process, thereby consuming the input array and producing a second output array;

writing the second output array into a second memory structure;

wherein writing to the first memory structure is in an order different than the reading from the first memory structure;

wherein the input array is a first permutation of the first output array;

wherein writing to the second memory structure is in a different order than the writing to the first memory structure and is in a different order than the reading from the first memory structure;

wherein the second output array is a second permutation of the input array;

wherein the second permutation is the inverse of the first permutation;

wherein at least one of the first and second processes comprises sub-processes, consuming and producing respectively part of the related input and output array;

wherein the sub-processes of a process are executed substantially simultaneously; and wherein writing of parts of the output array, each part being produced by one of the sub-processes of the first or second process, is executed substantially simultaneously.

7. The method of claim 6, wherein reading of parts of the input array, each part being consumed by one of the sub-processes of the first or second process, is executed substantially simultaneously.

8. An interleaving and deinterleaving apparatus, comprising:

a first computing device, capable of executing a first process, and producing a first output array;

a first memory, wherein the first output array is written;

a second computing device, capable of executing a second process, consuming an input array read from the first memory, and producing a second output array;

a second memory wherein the second output array is written;

means for writing to the first memory in a different order than the reading from the first memory, such that the input array is a first permutation of the first output array; and means for writing to the second memory in a different order than the writing to the first memory and in a different order than the reading from the first memory, such that the second output array is a second pennutation of the input array, the second permutation being the inverse of the first permutation.

9. The apparatus of claim 8, wherein the first and second memory comprise a single memory.

10. The apparatus of claim 8, wherein the first and second memories comprise a plurality of sub-memories.

11. The apparatus of claim 8, wherein the computing devices are configured to substantially simultaneously execute a plurality of sub-processes, the sub-processes together defining the first and second process.

12. The apparatus of claim 8, wherein the first and second computing device comprise a single computing device.

13. An apparatus configured to perform iterative decoding on a serial data stream, the apparatus comprising:

a plurality of memories;

a plurality of decoders, each decoder at least partially decoding a portion of the serial data stream in parallel with the remaining decoders;

an address generation circuit configured to generate addresses for the plurality of memories;

a first data router configured to route data from the plurality of memories to the plurality of decoders; and a second data router configured to route data from the plurality of decoders to the plurality of memories.

14. The apparatus of claim 13, wherein the first and second data routers, the plurality of memories and decoders and the address generator co-operate to provide:

a first decoder configured to execute a first process, thereby producing a first output array;

means for writing the first output array into a first memory;

means for reading from the first memory an input array;

a second decoder configured to execute a second process, thereby consuming the input array and producing a second output array;

means for writing the second output array into a second memory, wherein the input array is a first permutation of the first output array, and wherein the second output array is a second permutation of the input array, the second permutation being the inverse the first permutation.

15. The apparatus of claim 13, wherein the address generator comprises means for generating the addresses for writing data elements to or for reading data elements from the memories, the means for generating the addresses comprising:

means for reading serial elements into the matrix according to a first direction of the matrix;

means for reading the elements from the matrix in a second direction of the matrix, the second direction being different from the first direction; and wherein the order of reading elements out of the matrix determines the storage locations of the data elements in the sub-memories.

16. A method of interleaving and deinterleaving, the method comprising:

executing a first process, thereby producing a first output array;

writing the first output array into a first memory structure;

reading an input array from the first memory structure;

executing a second process, thereby consuming the input array and producing a second output array;

writing the second output array into a second memory structure;

wherein writing to the first memory structure is in an order different than the reading from the first memory structure;

wherein the input array is a first permutation of the first output array;

wherein writing to the second memory structure is in a different order than the writing to the first memory structure and is in a different order than the reading from the first memory structure;

wherein the second output array is a second permutation of the input array;

wherein the second permutation is the inverse of the first permutation; and wherein the memory structures being configured to store at least an array of the size of the input and output arrays, comprise separate sub-memories, each of the separate sub-memories being configured to store at least parts of the input arrays and output arrays.

17. The method of claim 16, wherein each of the separate sub-memories is configured to store at most an array of the size of the input array and output arrays divided by N−1, N being the amount of different sub-memories in a memory structure.

18. The method of claim 16, wherein addresses for writing data elements to or for reading data elements from the sub-memories is determined by the method comprising:

determining an output order of matrix elements of a matrix by reading serial elements into the matrix according to a first direction of the matrix;

reading the elements from the matrix in a second direction of the matrix, the second direction being different from the first direction; and wherein the order of reading out of the matrix elements determines the storage locations of the data elements in the sub-memories.

19. The method of claim 18, wherein dimensions of the matrix are selected such that the writing and reading results in a collision-free reading or writing to the sub-memories.

20. The method of claim 18, wherein the matrix has dimensions and the dimensions of the matrix are selected such that one of the dimensions does not divide the other of the dimensions.

21. The method of claim 18, further comprising shifting the matrix elements read out of the matrix in the first or second directions.

* * * * *